(12) United States Patent
Mishra et al.

(10) Patent No.: US 9,941,399 B2
(45) Date of Patent: Apr. 10, 2018

(54) ENHANCEMENT MODE III-N HEMTS

(71) Applicant: Transphorm Inc., Goleta, CA (US)

(72) Inventors: Umesh Mishra, Montecito, CA (US);
Robert Coffie, Camarillo, CA (US);
Likun Shen, Goleta, CA (US); Ilan Ben-Yaacov, Goleta, CA (US); Primit Parikh, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 15/242,266

(22) Filed: Aug. 19, 2016

(65) Prior Publication Data

US 2016/0359030 A1  Dec. 8, 2016

Related U.S. Application Data

(60) Continuation of application No. 14/945,341, filed on Nov. 18, 2015, now Pat. No. 9,437,708, which is a
(Continued)

(51) Int. Cl.
*H03H 11/46* (2006.01)
*H01L 29/778* (2006.01)
(Continued)

(52) U.S. Cl.
CPC ...... *H01L 29/7784* (2013.01); *H01L 21/0217* (2013.01); *H01L 21/0254* (2013.01);
(Continued)

(58) Field of Classification Search
None
See application file for complete search history.

(56) References Cited

U.S. PATENT DOCUMENTS

| 4,645,562 A | 2/1987 | Liao et al. |
| 4,728,826 A | 3/1988 | Einzinger et al. |
| (Continued) | | |

FOREIGN PATENT DOCUMENTS

| CN | 1748320 | 3/2006 |
| CN | 101107713 | 1/2008 |
| (Continued) | | |

OTHER PUBLICATIONS

Authorized officer Chung Keun Lee, International Search Report and Written Opinion in PCT/US2008/076030, dated Mar. 23, 2009, 10 pages.
(Continued)

*Primary Examiner* — Ali Naraghi
(74) *Attorney, Agent, or Firm* — Fish & Richardson P.C.

(57) ABSTRACT

A III-N semiconductor device that includes a substrate and a nitride channel layer including a region partly beneath a gate region, and two channel access regions on opposite sides of the part beneath the gate. The channel access regions may be in a different layer from the region beneath the gate. The device includes an AlXN layer adjacent the channel layer wherein X is gallium, indium or their combination, and a preferably n-doped GaN layer adjacent the AlXN layer in the areas adjacent to the channel access regions. The concentration of Al in the AlXN layer, the AlXN layer thickness and the n-doping concentration in the n-doped GaN layer are selected to induce a 2DEG charge in channel access regions without inducing any substantial 2DEG charge beneath the gate, so that the channel is not conductive in the absence of a switching voltage applied to the gate.

8 Claims, 15 Drawing Sheets

Related U.S. Application Data continuation of application No. 14/464,639, filed on Aug. 20, 2014, now Pat. No. 9,196,716, which is a continuation of application No. 13/954,772, filed on Jul. 30, 2013, now Pat. No. 8,841,702, which is a division of application No. 12/108,449, filed on Apr. 23, 2008, now Pat. No. 8,519,438.

(51) Int. Cl.

| | | |
|---|---|---|
| *H01L 29/20* | (2006.01) | |
| *H01L 29/66* | (2006.01) | |
| *H01L 29/36* | (2006.01) | |
| *H01L 29/423* | (2006.01) | |
| *H01L 29/08* | (2006.01) | |
| *H01L 29/10* | (2006.01) | |
| *H01L 21/02* | (2006.01) | |
| *H01L 29/205* | (2006.01) | |
| *H01L 29/207* | (2006.01) | |
| *H01L 29/51* | (2006.01) | |

(52) U.S. Cl.
CPC ...... *H01L 29/0847* (2013.01); *H01L 29/1033* (2013.01); *H01L 29/2003* (2013.01); *H01L 29/205* (2013.01); *H01L 29/207* (2013.01); *H01L 29/365* (2013.01); *H01L 29/4236* (2013.01); *H01L 29/518* (2013.01); *H01L 29/66431* (2013.01); *H01L 29/66462* (2013.01); *H01L 29/7783* (2013.01); *H01L 29/7787* (2013.01); *H01L 29/7788* (2013.01)

(56) References Cited

U.S. PATENT DOCUMENTS

| | | | |
|---|---|---|---|
| 4,821,093 A | | 4/1989 | Iafrate et al. |
| 4,914,489 A | | 4/1990 | Awano |
| 5,329,147 A | | 7/1994 | Vo et al. |
| 5,449,929 A | * | 9/1995 | Hosogi .................. B82Y 10/00 257/194 |
| 5,646,069 A | | 7/1997 | Jelloian et al. |
| 5,705,847 A | | 1/1998 | Kashiwa et al. |
| 5,714,393 A | | 2/1998 | Wild et al. |
| 5,998,810 A | | 12/1999 | Hatano et al. |
| 6,008,684 A | | 12/1999 | Ker et al. |
| 6,097,046 A | | 8/2000 | Plumton |
| 6,100,571 A | | 8/2000 | Mizuta et al. |
| 6,316,793 B1 | | 11/2001 | Sheppard et al. |
| 6,373,082 B1 | | 4/2002 | Ohno et al. |
| 6,475,889 B1 | | 11/2002 | Ring |
| 6,486,502 B1 | | 11/2002 | Sheppard et al. |
| 6,515,303 B2 | | 2/2003 | Ring |
| 6,548,333 B2 | | 4/2003 | Smith |
| 6,583,454 B2 | | 6/2003 | Sheppard et al. |
| 6,586,781 B2 | | 7/2003 | Wu et al. |
| 6,649,497 B2 | | 11/2003 | Ring |
| 6,727,531 B1 | | 4/2004 | Redwing et al. |
| 6,777,278 B2 | | 8/2004 | Smith |
| 6,849,882 B2 | | 2/2005 | Chavarkar et al. |
| 6,867,078 B1 | | 3/2005 | Green et al. |
| 6,946,739 B2 | | 9/2005 | Ring |
| 6,979,863 B2 | | 12/2005 | Ryu |
| 6,982,204 B2 | | 1/2006 | Saxler et al. |
| 7,030,428 B2 | | 4/2006 | Saxler |
| 7,045,404 B2 | | 5/2006 | Sheppard et al. |
| 7,053,413 B2 | | 5/2006 | D'Evelyn et al. |
| 7,071,498 B2 | | 7/2006 | Johnson et al. |
| 7,084,475 B2 | | 8/2006 | Shelton et al. |
| 7,125,786 B2 | | 10/2006 | Ring et al. |
| 7,126,212 B2 | | 10/2006 | Enquist et al. |
| 7,161,194 B2 | | 1/2007 | Parikh et al. |
| 7,170,111 B2 | | 1/2007 | Saxler |
| 7,230,284 B2 | * | 6/2007 | Parikh ..................... H01L 29/518 257/192 |
| 7,238,560 B2 | | 7/2007 | Sheppard et al. |
| 7,253,454 B2 | | 8/2007 | Saxler |
| 7,265,399 B2 | | 9/2007 | Sriram et al. |
| 7,268,375 B2 | | 9/2007 | Shur et al. |
| 7,304,331 B2 | | 12/2007 | Saito et al. |
| 7,321,132 B2 | | 1/2008 | Robinson et al. |
| 7,326,971 B2 | | 2/2008 | Harris et al. |
| 7,332,795 B2 | | 2/2008 | Smith et al. |
| 7,364,988 B2 | | 4/2008 | Harris et al. |
| 7,388,236 B2 | | 6/2008 | Wu et al. |
| 7,419,892 B2 | | 9/2008 | Sheppard et al. |
| 7,432,142 B2 | | 10/2008 | Saxler et al. |
| 7,456,443 B2 | | 11/2008 | Saxler et al. |
| 7,465,967 B2 | | 12/2008 | Smith et al. |
| 7,501,669 B2 | | 3/2009 | Parikh et al. |
| 7,544,963 B2 | | 6/2009 | Saxler |
| 7,547,925 B2 | | 6/2009 | Wong et al. |
| 7,548,112 B2 | | 6/2009 | Sheppard |
| 7,550,783 B2 | | 6/2009 | Wu et al. |
| 7,550,784 B2 | | 6/2009 | Saxler et al. |
| 7,566,918 B2 | | 7/2009 | Wu et al. |
| 7,573,078 B2 | | 8/2009 | Wu et al. |
| 7,592,211 B2 | | 9/2009 | Sheppard et al. |
| 7,598,108 B2 | | 10/2009 | Li et al. |
| 7,612,390 B2 | | 11/2009 | Saxler et al. |
| 7,615,774 B2 | | 11/2009 | Saxler |
| 7,638,818 B2 | | 12/2009 | Wu et al. |
| 7,678,628 B2 | | 3/2010 | Sheppard et al. |
| 7,692,263 B2 | | 4/2010 | Wu et al. |
| 7,709,269 B2 | | 5/2010 | Smith et al. |
| 7,709,859 B2 | | 5/2010 | Smith et al. |
| 7,745,851 B2 | | 6/2010 | Harris |
| 7,755,108 B2 | | 7/2010 | Kuraguchi |
| 7,759,700 B2 | | 7/2010 | Ueno et al. |
| 7,777,252 B2 | | 8/2010 | Sugimoto et al. |
| 7,777,254 B2 | | 8/2010 | Sato |
| 7,795,642 B2 | | 9/2010 | Suh et al. |
| 7,812,369 B2 | | 10/2010 | Chini et al. |
| 7,855,401 B2 | | 12/2010 | Sheppard et al. |
| 7,859,020 B2 | | 12/2010 | Kikkawa et al. |
| 7,875,537 B2 | | 1/2011 | Suvorov et al. |
| 7,875,914 B2 | | 1/2011 | Sheppard |
| 7,884,395 B2 | | 2/2011 | Saito |
| 7,892,974 B2 | | 2/2011 | Ring et al. |
| 7,893,500 B2 | | 2/2011 | Wu et al. |
| 7,901,994 B2 | | 3/2011 | Saxler et al. |
| 7,906,799 B2 | | 3/2011 | Sheppard et al. |
| 7,915,643 B2 | | 3/2011 | Suh et al. |
| 7,915,644 B2 | | 3/2011 | Wu et al. |
| 7,919,791 B2 | | 4/2011 | Flynn et al. |
| 7,928,475 B2 | | 4/2011 | Parikh et al. |
| 7,948,011 B2 | | 5/2011 | Rajan et al. |
| 7,955,918 B2 | | 6/2011 | Wu et al. |
| 7,956,383 B2 | | 6/2011 | Kuroda et al. |
| 7,960,756 B2 | | 6/2011 | Sheppard et al. |
| 7,965,126 B2 | | 6/2011 | Honea et al. |
| 7,985,986 B2 | | 7/2011 | Heikman et al. |
| 8,039,352 B2 | | 10/2011 | Mishra et al. |
| 8,049,252 B2 | | 11/2011 | Smith et al. |
| 8,519,438 B2 | | 8/2013 | Mishra et al. |
| 8,841,702 B2 | | 9/2014 | Mishra et al. |
| 9,196,716 B2 | | 11/2015 | Mishra et al. |
| 2001/0032999 A1 | | 10/2001 | Yoshida |
| 2001/0040247 A1 | | 11/2001 | Ando et al. |
| 2002/0036287 A1 | | 3/2002 | Yu et al. |
| 2002/0121648 A1 | | 9/2002 | Hsu et al. |
| 2002/0167023 A1 | | 11/2002 | Chavarkar et al. |
| 2003/0003724 A1 | | 1/2003 | Uchiyama et al. |
| 2003/0006437 A1 | | 1/2003 | Mizuta et al. |
| 2003/0020092 A1 | | 1/2003 | Parikh et al. |
| 2004/0041169 A1 | | 3/2004 | Ren et al. |
| 2004/0061129 A1 | | 4/2004 | Saxler et al. |
| 2004/0164347 A1 | | 8/2004 | Zhao et al. |
| 2005/0001235 A1 | | 1/2005 | Murata et al. |
| 2005/0077541 A1 | | 4/2005 | Shen et al. |
| 2005/0133816 A1 | | 6/2005 | Fan et al. |
| 2005/0189561 A1 | | 9/2005 | Kinzer et al. |
| 2005/0189562 A1 | | 9/2005 | Kinzer et al. |
| 2005/0194612 A1 | | 9/2005 | Beach |

(56) References Cited

U.S. PATENT DOCUMENTS

| | | |
|---|---|---|
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0108606 A1 | 5/2006 | Saxler et al. |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0214196 A1* | 9/2006 | Saxler ................ H01L 29/0649 257/243 |
| 2006/0220063 A1 | 10/2006 | Kurachi et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0278518 A1 | 12/2007 | Chen et al. |
| 2007/0295985 A1 | 12/2007 | Weeks, Jr. et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0272397 A1 | 11/2008 | Koudymov et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0121775 A1 | 5/2009 | Ueda et al. |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2010/0019225 A1 | 1/2010 | Lee |
| 2010/0019279 A1 | 1/2010 | Chen et al. |
| 2010/0067275 A1 | 3/2010 | Wang et al. |
| 2010/0201439 A1 | 8/2010 | Wu et al. |
| 2011/0006346 A1 | 1/2011 | Ando et al. |
| 2011/0012110 A1 | 1/2011 | Sazawa et al. |
| 2012/0168822 A1 | 7/2012 | Matsushita |
| 2012/0217512 A1 | 8/2012 | Renaud |
| 2013/0316502 A1 | 11/2013 | Mishra et al. |
| 2014/0361309 A1 | 12/2014 | Mishra et al. |
| 2016/0071951 A1 | 3/2016 | Mishra et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |

OTHER PUBLICATIONS

Authorized officer Yolaine Cussac, International Preliminary Report on Patentability in PCT/US2008/076030, dated Mar. 25, 2010, 5 pages.

Authorized officer Chung Keun Lee, International Search Report and Written Opinion in PCT/US2008/076079, dated Mar. 20, 2009, 11 pages.

Authorized officer Nora Lindner, International Preliminary Report on Patentability in PCT/US2008/076079, dated Apr. 1, 2010, 6 pages.

Authorized officer Keon Hyeong Kim, International Search Report and Written Opinion in PCT/US2008/076160 dated Mar. 18, 2009, 11 pages.

Authorized officer Simin Baharlou, International Preliminary Report on Patentability in PCT/US2008/076160, dated Mar. 25, 2010, 6 pages.

Authorized officer Chung Keun Lee, International Search Report and Written Opinion in PCT/US2008/076199, dated Mar. 24, 2009, 11 pages.

(56) References Cited

OTHER PUBLICATIONS

Authorized officer Dorothée Mülhausen, International Preliminary Report on Patentability in PCT/US2008/076199, dated Apr. 1, 2010, 6 pages.
Authorized officer Keon Hyeong Kim, International Search Report and Written Opinion in PCT/US2008/085031, dated Jun. 24, 2009, 11 pages.
Authorized officer Yolaine Cussac, International Preliminary Report on Patentability in PCT/US2008/085031, dated Jun. 24, 2010, 6 pages.
Authorized officer Tae Hoon Kim, International Search Report and Written Opinion in PCT/US2009/041304, dated Dec. 18, 2009, 13 pages.
Authorized officer Dorothée Mülhausen, International Preliminary Report on Patentability, in PCT/US2009/041304, dated Nov. 4, 2010, 8 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Cheon Whan Cho, International Search Report and Written Opinion in PCT/US2009/066647, dated Jul. 1, 2010, 16 pages.
Authorized officer Athina Nikitas-Etienne, International Preliminary Report on Patentability in PCT/US2009/066647, dated Jun. 23, 2011, 12 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Sang Ho Lee, International Search Report and Written Opinion in PCT/US2010/034579, dated Dec. 24, 2010, 9 pages.
Authorized officer Nora Lindner, International Preliminary Report on Patentability in PCT/US2010/034579, dated Nov. 24, 2011, 7 pages.
Authorized officer Jeongmin Choi, International Search Report and Written Opinion in PCT/US2010/046193, dated Apr. 26, 2011, 13 pages.
Authorized officer Philippe Bécamel, International Preliminary Report on Patentability in PCT/US2010/046193, dated Mar. 8, 2012, 10 pages.
Authorized officer Sang Ho Lee, International Search Report and Written Opinion in PCT/US2010/059486, dated Jul. 26, 2011, 9 pages.
Authorized officer Nora Lindner, International Preliminary Report on Patentability in PCT/US2010/059486, dated Jun. 21, 2012, 6 pages.
Authorized officer Kwan Sik Sul, International Search Report and Written Opinion in PCT/US2011/063975, dated May 18, 2012, 8 pages.
Authorized officer Simin Baharlou, International Preliminary Report on Patentability in PCT/US2011/063975, dated Jun. 27, 2013, 5 pages.
Authorized officer Sang-Taek Kim, International Search Report and Written Opinion in PCT/US2011/061407, dated May 22, 2012, 10 pages.
Authorized officer Lingfei Bai, International Preliminary Report on Patentability in PCT/US2011/061407, dated Jun. 6, 2013, 7 pages.
Authorized officer Kwan Sik Sul, International Search Report and Written Opinion in PCT/US2012/023160, dated May 24, 2012, 9 pages.
Authorized officer Simin Baharlou, International Preliminary Report on Patentability in PCT/US2012/023160, dated Aug. 15, 2013, 6 pages.
Authorized officer Jeongmin Choi, International Search Report and Written Opinion in PCT/US2012/027146, dated Sep. 24, 2012, 12 pages.
Authorized officer Athina Nickitas-Etienne, International Preliminary Report on Patentability in PCT/US2012/027146, dated Sep. 19, 2013, 9 pages.
Authorized officer Tae Hoon Kim, International Search Report and Written Opinion in PCT/US2014/027523, dated Jul. 30, 2014, 14 pages.
Search Report and Action in TW Application No. 098132132, dated Dec. 6, 2012, 8 pages.
Chinese First Office Action for Application No. 200880120050.6, dated Aug. 2, 2011, 10 pages.
Chinese First Office Action for Application No. 200980114639.X, dated May 14, 2012, 13 pages.
Ando et al., "10-W/mm AlGaN-GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.

(56) References Cited

OTHER PUBLICATIONS

Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.

Karmalkar and Mishra, "Very High Voltage AlGaN/GaN High Electron Mobility Transistors Using a Field Plate Deposited on a Stepped Insulator," Solid-State Electronics, 2001, 45:1645-1652.

Keller et al., "GaN-GaN Junctions with Ultrathin AlN Interlayers: Expanding Heterojunction Design," Applied Physics Letters, 2002, 80(23):4387-4389.

Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.

Khan et al., "AlGaN/GaN Metal Oxide Semiconductor Heterostructure Field Effect Transistor," IEEE Electron Device Letters, 2000, 21(2):63-65.

Kim, "Process Development and Device Characteristics of AlGaN/GaN HEMTs for High Frequency Applications," PhD Thesis, University of Illinois at Urbana-Champaign, 2007, 120 pages.

Kumar et al., "High Transconductance Enhancement-mode AlGaN/GaN HEMTs on SiC Substrate," Electronics Letters, 2003, 39(24):1758-1760.

Kuraguchi et al., "Normally-off GaN-MISFET with Well-controlled Threshold Voltage," Phys. Stats. Sol., 2007, 204(6):2010-2013.

Lanford et al., "Recessed-gate Enhancement-mode GaN HEMT with High Threshold Voltage," Electronic Letters, 2005, 41(7):449-450.

Lee et al., "Self-aligned Process for Emitter- and Base-regrowth GaN HBTs and BJTs," Solid-State Electronics, 2001, 45:243-247.

Marchand et al., "Metalorganic Chemical Vapor Deposition on GaN on Si(111): Stress Control and Application to Filed-effect Transistors," Journal of Applied Physics, 2001, 89(12):7846-7851.

Mishra et al., "N-face High Electron Mobility Transistors with Low Buffer Leakage and Low Parasitic Resistance," U.S. Appl. No. 60/908,914, filed Mar. 29, 2007, 21 pages.

Mishra et al., "Polarization-induced Barriers for N-face Nitride-based Electronics," U.S. Appl. No. 60/940,052, filed May 24, 2007, 29 pages.

Mishra et al., "Growing N-polar III-nitride structures," U.S. Appl. No. 60/972,467, filed Sep. 14, 2007, 7 pages.

Mishra et al., "AlGaN/GaN HEMTs—An Overview of Device Operation and Applications," Proceedings of the IEEE, 2002, 90(6):1022-1031.

Nanjo et al., "Remarkable Breakdown Voltage Enhancement in AlGaN Channel High Electron Mobility Transistors," Applied Physics Letters 92 (2008), 3 pages.

Napierala et al., "Selective GaN Epitaxy on Si(111) Substrates Using Porous Aluminum Oxide Buffer Layers," Journal of the Electrochemical Society, 2006. 153(2):G125-G127, 4 pages.

Ota and Nozawa, "AlGaN/GaN Recessed MIS-gate HFET with High-threshold-voltage Normally-off Operation for Power Electronics Applications," IEEE Electron Device Letters, 2008, 29(7):668-670.

Palacios et al., "AlGaN/GaN HEMTs with an InGaN-based Back-barrier," Device Research Conference Digest, 2005, DRC '05 63rd, pp. 181-182.

Palacios et al., "AlGaN/GaN High Electron Mobility Transistors with InGaN Back-Barriers," IEEE Electron Device Letters, 2006, 27(1):13-15.

Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.

Palacios et al., "Nitride-based High Electron Mobility Transistors with a GaN Spacer," Applied Physics Letters, 2006, 89:073508-1-3.

Pei et al., "Effect of Dielectric Thickness on Power Performance of AlGaN/GaN HEMTs," IEEE Electron Device Letters, 2009, 30(4):313-315.

"Planar, Low Switching Loss, Gallium Nitride Devices for Power Conversion Applications," SBIR N121-090 (Navy), 2012, 3 pages.

Rajan et al., "Advanced Transistor Structures Based on N-face GaN," 32M International Symposium on Compound Semiconductors (ISCS), Sep. 18-22, 2005, Europa-Park Rust, Germany, 2 pages.

Reiher et al., "Efficient Stress Relief in GaN Heteroepitaxy on Si(111) Using Low-temperature AlN Interlayers," Journal of Crystal Growth, 2003, 248:563-567.

Saito et al., "Recessed-gate Structure Approach Toward Normally Off High-voltage AlGaN/GaN HEMT for Power Electronics Applications," IEEE Transactions on Electron Device, 2006, 53(2):356-362.

Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 192 pages.

Sugiura et al., "Enhancement-mode n-channel GaN MOSFETs Fabricated on p-GaN Using $HfO_2$ as Gate Oxide," Electronics Letters, 2007, vol. 43, No. 17, 2 pages.

Suh et al., "High Breakdown Enhancement Mode GaN-based HEMTs with Integrated Slant Field Plate," U.S. Appl. No. 60/822,886, filed Aug. 18, 2006, 16 pages.

Suh et al. "High-Breakdown Enhancement-mode AlGaN/GaN HEMTs with Integrated Slant Field-Plate," Electron Devices Meeting, 2006, IEDM '06 International, 3 pages.

Suh et al., "III-Nitride Devices with Recessed Gates," U.S. Appl. No. 60/972,481, filed Sep. 14, 2007, 18 pages.

Tipirneni et al. "Silicon Dioxide-encapsulated High-Voltage AlGaN/GaN HFETs for Power-Switching Applications," IEEE Electron Device Letters, 2007, 28(9):784-786.

Vetury et al., "Direct Measurement of Gate Depletion in High Breakdown (405V) Al/GaN/GaN Heterostructure Field Effect Transistors," IEDM 98, 1998, pp. 55-58.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1MHz,"Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

Authorized officer Nora Lindner, International Preliminary Report on Patentability in PCT/US2014/027523, dated Sep. 24, 2015, 11 pages.

\* cited by examiner

ENHANCEMENT MODE III-N HEMTS

CROSS-REFERENCE TO RELATED APPLICATIONS

This application is a continuation of U.S. application Ser. No. 14/945,341, filed on Nov. 18, 2015, which is a continuation of U.S. application Ser. No. 14/464,639, filed on Aug. 20, 2014 (U.S. Pat. No. 9,196,716), which is a continuation of U.S. application Ser. No. 13/954,772, filed Jul. 30, 2013 (now U.S. Pat. No. 8,841,702), which is a divisional of U.S. application Ser. No. 12/108,449, filed Apr. 23, 2008 (now U.S. Pat. No. 8,519,438). The disclosures of the prior applications are considered part of and are incorporated by reference in the disclosure of this application.

TECHNICAL FIELD

This invention relates to enhancement mode III-nitride devices.

BACKGROUND

Most power semiconductor devices, including devices such as power MOSFETs and insulated gate bipolar transistors (IGBTs), typically have been fabricated with silicon (Si) semiconductor material. More recently, silicon carbide (SiC) power devices have been considered due to their superior properties. III-N semiconductor devices, such as gallium nitride (GaN) devices are now emerging as attractive candidates to carry large currents, support high voltages and to provide very low on-resistance and fast switching times.

Typical GaN high electron mobility transistors (HEMTs) and related devices are normally on, which means that they conduct current at zero gate voltage. These typical devices are known as depletion mode (D-mode) devices. However, it is more desirable in power electronics to have normally off devices—called enhancement mode (E-mode) devices—that do not conduct current at zero gate voltage and thus avoid damage to the device or to other circuit components by preventing accidental turn on of the device.

FIG. 1 shows a prior art Ga-face GaN HEMT depletion mode structure. Substrate 10 may be GaN, SiC, sapphire, Si, or any other suitable substrate upon which a GaN device may be formed. GaN buffer layer 14 and $Al_xGaN$ layer 18 on top of it are oriented in the [0 0 0 1] (C-plane) direction. The conducting channel consists of a two-dimensional electron gas (2DEG) region, shown by a dotted line in GaN buffer layer 14 in FIG. 1, is formed in layer 14 near the interface between layer 14 and $Al_xGaN$ layer 18. A thin, 0.6 nm AlN layer (not shown) is optionally included between GaN layer 14 and $Al_xGaN$ layer 18 in order to increase the charge density and mobility in the 2DEG region. The region of layer 14 between the source 27 and the gate 26 is referred to as the source access region. The region of layer 14 between the drain 28 and gate 26 is referred to as the drain access region. The source 27 and drain 28 both make contact with buffer layer 14. With no applied gate voltage, the 2DEG region extends all the way from the source 27 to the drain 28, forming a conducting channel and rendering the device normally on, making it a depletion mode device. A negative voltage must be applied to the gate 26 to deplete the 2DEG region under the gate 26, and thus to turn the device OFF.

Another related prior art III-N HEMT device is the subject of provisional application Ser. No. 60/972,481, filed Sep. 14, 2007, entitled "III-N Devices with Recessed Gates," which application is hereby incorporated by reference herein.

SUMMARY

The device of the invention is an enhancement mode HEMT. Different from a depletion mode HEMT, an enhancement-mode HEMT has two requirements. First, the source and drain access regions should contain a 2DEG region that results in a conductivity of those regions at least as large as the conductivity of the channel region beneath the gate when the device is in the ON state. Preferably, the conductivity of these access regions is as large as possible, as access resistance is thereby reduced, thus reducing the on-resistance $R_{on}$—a desirable characteristic for a switching device. The second requirement of an enhancement mode HEMT is for the channel region underneath the gate to have no 2DEG at zero gate voltage. A positive gate voltage therefore is required to induce a 2DEG charge in this region beneath the gate, and thus to turn the device ON.

Therefore, at all times (whether the device is on or off), an E-mode HEMT has a 2DEG region across both the access regions. When 0V is applied to the gate, there is no 2DEG under the gate, but when a large enough voltage is applied to the gate (i.e., Vgs>Vth) a 2DEG region forms underneath the gate and the channel becomes fully conductive between source and drain.

Briefly, the disclosed semiconductor device includes a substrate and a nitride channel layer on the substrate, the channel layer including a first channel region beneath a gate region, and two channel access regions on opposite sides of the first channel region. The composition of the nitride channel layer is selected from the group consisting of the nitrides of gallium, indium and aluminum, and combinations thereof. Adjacent the channel layer is an AlXN layer wherein X is selected from the group consisting of gallium, indium or their combination. An n-doped GaN layer is adjacent the AlXN layer in the areas adjacent to the channel access regions, but not in the area adjacent to the first channel region beneath the gate region.

The concentration of Al in the AlXN layer, the AlXN layer thickness and the n-doping concentration and doping profile in the n-doped GaN layer all are selected to induce a 2DEG charge in channel access regions adjacent the AlXN layer, without inducing any substantial 2DEG charge in the first channel region beneath the gate, so that the channel is not conductive in the absence of a control voltage applied to the gate, but can readily become conductive when a control voltage is applied to the gate.

A similar disclosed semiconductor device includes a substrate, a nitride channel layer on the substrate including a first channel region beneath a gate region, and two channel access regions on opposite sides of the first channel region, the composition of the nitride channel layer being selected from the group consisting of nitrides of gallium, indium and aluminum, and combinations thereof. The device also has a first AlXN layer adjacent the channel layer wherein X is selected from the group consisting of gallium, indium or their combination, and a second AlXN layer adjacent the first AlXN layer, the first AlXN layer having a substantially higher concentration of Al than the second AlXN layer.

In this device, the concentration of the Al in each of the first and second AlXN layers, respectively, and their respective thicknesses are selected to induce a 2DEG charge in channel access regions adjacent the first AlXN layer, without inducing any substantial 2DEG charge in the first channel region beneath the gate, so that the channel is not conductive in the absence of a control voltage applied to the gate, but can readily become conductive when a control voltage is applied to the gate.

Another disclosed device includes a substrate, a nitride channel layer on the substrate, including a first channel region, the material of which is selected from the group consisting of nitrides of gallium, indium, aluminum and combinations thereof. The device further comprises an AlXN layer adjacent to the channel and a III-N adjacent to the AlXN layer, the III-N layer also including two channel access region on the opposite sides of the gate, wherein X is selected from the group consisting of gallium, indium or their combination, and the III material is Al, Ga or In. The channel access regions in this device are in a different layer from the channel region being modulated by the gate.

In the above devices, a nitride layer, such as AlN, may be interposed between the AlXN layer and the nitride channel layer.

DESCRIPTION OF PREFERRED EMBODIMENTS

Figure 1:
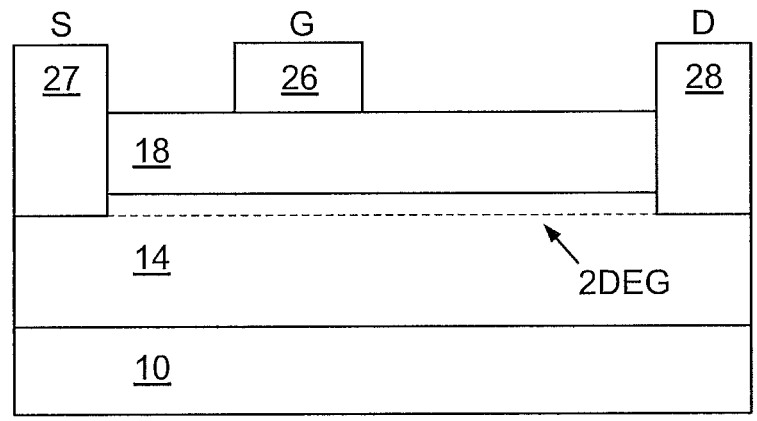
FIG. 1 is a cross-sectional view of a device of the prior art.
Figure 2:
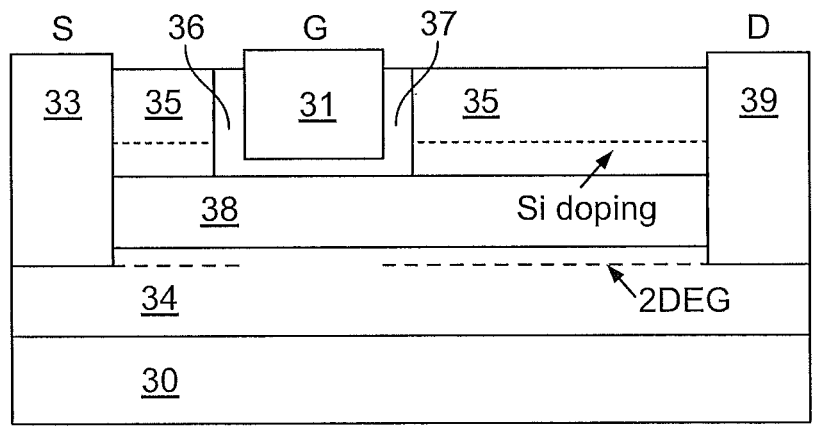
FIG. 2 is a cross-sectional view of a device of one embodiment of the invention.

FIG. 2 shows one embodiment of an E-mode GaN HEMT device of this invention. Substrate 30 may be GaN, SiC, sapphire, Si, or any other suitable substrate for a GaN device as is known in the art. Nitride channel layer 34 may be placed upon substrate 30. This layer may be a nitride of gallium, indium or aluminum, or combinations of those nitrides. A preferred material is GaN. Layer 34 may be made semi-insulating, such as by doping with iron. Preferably channel layer 34 may be C-plane oriented, such that the surfaces furthest from the substrate are [0 0 0 1] surfaces. Alternatively, it may be a semi-polar structure with Ga termination, as is known in the art. Alternatively, it may be grown as a non-polar structure using n-doping, as will be described below.

A thin layer 38 of $Al_xXN$ is placed on top of the GaN layer 34. In this layer, the "X" material may be gallium, indium or a combination of the two. A preferable material for this layer 38 is $Al_xGaN$. For this embodiment, layer 38 will be referred to as an $Al_xGaN$ layer, although it may be these other materials as well. In another embodiment of the invention, layer 38 may be AlN. $Al_xGaN$ layer 38 should be sufficiently thin so that no significant 2DEG is established underneath the gate 31 when zero volts is applied to the gate. Layer 35 is formed over layer 38, and it may be n-doped, as will be discussed below.

Gate 31 source 33 and drain 39 may be any suitable metal or other electrically conductive material. Preferably, an insulating layer 36 is formed between gate 31 and adjacent layers 35 and 38. Prior to the formation of source and drain contacts 33 and 39, respectively, layers 35 and 38 are etched so that the bottoms of these source and drain contacts can make electrical contact with nitride channel layer 34.

Figure 3A:
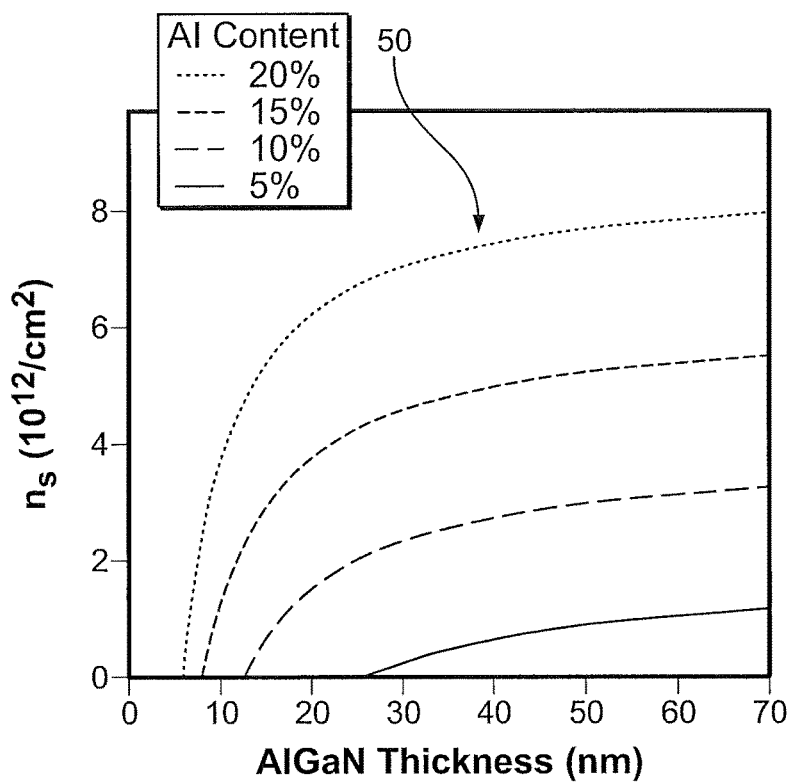
FIGS. 3a and 3b are graphs showing the relationship of the thickness of one layer of the device of FIG. 2 and the sheet charge density.
Figure 3B:
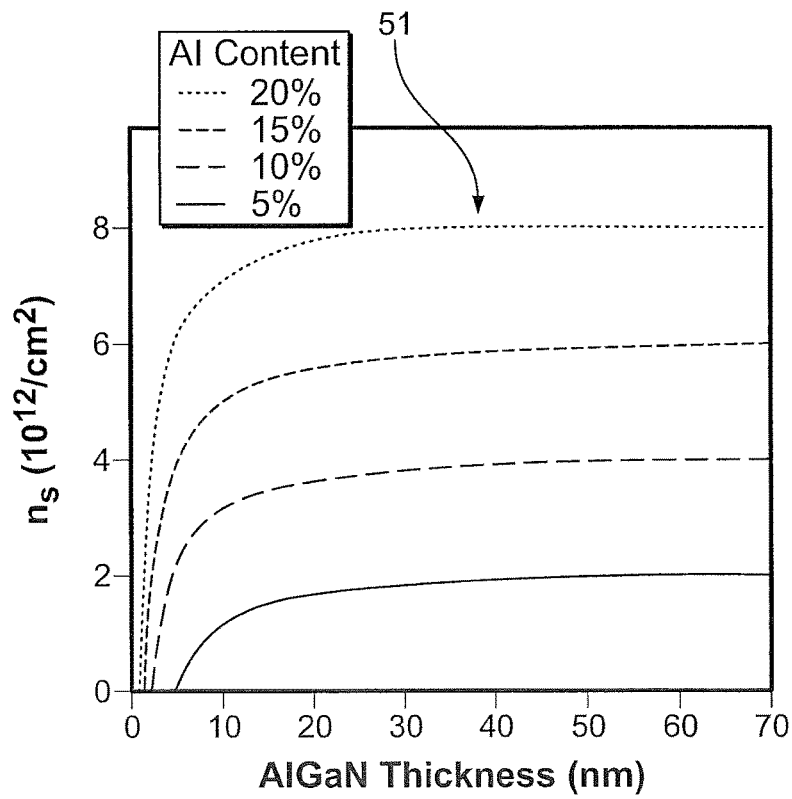

The graphs of FIGS. 3a and 3b show a plot of the 2DEG sheet charge density $n_s$ underneath the gate 31 of the device shown in FIG. 2 with zero volts applied to the gate, versus the $Al_xGaN$ layer 38 thickness (t) for a number of different Al compositions. The graph of FIG. 3a illustrates the charge density for a device structure without an intermediate AlN layer; the graph of FIG. 3b illustrates the charge density for a device structure with an intermediate AlN layer.

For appropriately chosen thicknesses of the layers, it is possible to keep the polarization-induced charge density $n_s$ small, or to eliminate it completely. As seen in FIGS. 2 and 3a and 3b, for a given Al concentration in the $Al_xGaN$ layer 38, there is a minimum layer thickness required to form a 2DEG under the gate at zero gate bias. For structures in which the $Al_xGaN$ thickness is less than a minimum thickness, no 2DEG region is formed underneath the gate at zero gate voltage, which prevents the device from being normally ON. Thus the minimum thickness required to form a 2DEG underneath the gate at zero gate bias is about the same as the maximum thickness for which the device will be normally OFF and therefore operate as an enhancement mode device.

The maximum thickness of the $Al_xGaN$ layer 38 such that no significant 2DEG charge is present in the channel region underneath the gate at zero gate voltage depends upon how much Al is present in the layer, as illustrated in FIGS. 3a and 3b. In general, the greater the Al concentration, the thinner the layer must be to ensure that no significant 2DEG charge is present in the channel region underneath the gate at zero gate voltage. Referring to FIGS. 2 and 3a, for a device without an intermediate AlN layer and 20% Al (the top curve 50), no charge will be induced if the thickness of the layer 38 is below about 6 nm, whereas for 10% Al, no charge will be induced if the thickness of the layer 38 is below about 12 nm. Similarly, for FIG. 3b, measured with a device with a 0.6 nm thick intermediate AlN layer, for 20% Al (the top curve 51), no charge will be induced if the thickness of the layer 38 is below about 1 nm, whereas for 10% Al, no charge will be induced if the thickness of the layer 38 is below about 2 nm.

In devices where the Al$_x$GaN layer 38 is thin enough such that no significant 2DEG exists underneath the gate at zero gate voltage, for a given thickness of layer 38, the leakage current when the device is in the OFF state increases with increasing Al composition, as a result of the corresponding decrease in the source-drain barrier when the device is in the OFF state. For example, a device with a 5 nm thick Al$_x$GaN layer that contains 20% Al will exhibit more leakage than a device with a 5 nm thick Al$_x$GaN layer containing 10% Al. Therefore, for a given thickness of layer 38, a lower Al composition results in a higher threshold voltage and lower leakage when the device is biased OFF, both of which are desirable in an enhancement mode device.

However, as will be further discussed below, the maximum 2DEG charge that can be induced in the access regions increases with increasing Al concentration in layer 38. Increasing the 2DEG charge in the access regions reduces the on-resistance R$_{on}$ of the device. Therefore, the Al composition in layer 38 should be at least high enough that a sufficient amount of charge can be induced in the access regions to satisfy the R$_{on}$ requirements of the application for which the device is being used.

In the embodiment of the invention shown in FIG. 2, on top of Al$_x$GaN layer 38 is a second Al$_y$GaN layer 35. If desired, y can be 0, so that the layer is entirely GaN. Layer 35 is required to provide 2DEG charge in the channel access regions of layer 34 between the source 33 and the gate 31, and between the drain 39 and the gate 31. For devices in which layer 35 is entirely GaN, there is no net polarization-induced field in layer 35 contributing to the formation of 2DEG charge in the channel access regions. Therefore, for devices in which layer 35 is undoped or unintentionally doped GaN, no significant 2DEG will be present in the access regions, and an enhancement mode device would not be feasible.

For devices in which y>0 in Al$_y$GaN layer 35 and layer 35 is undoped or unintentionally doped, the polarization-induced field in this layer can contribute to the formation of a 2DEG charge in the channel access regions. For a given Al composition and thickness of layer 38 and a given Al composition in layer 35, there is a minimum thickness of layer 35 required to induce a 2DEG charge in the channel access regions. This minimum thickness decreases by increasing the Al composition in layer 35 and/or in layer 38. For structures where layer 35 is greater than a minimum thickness, the 2DEG charge concentration in the channel access regions increases with increasing thickness of layer 35, but can never exceed the saturation charge concentration for the structure. The saturation charge concentration, which is the maximum charge that can be induced in the 2DEG regions, depends upon the Al composition in layers 35 and 38 and upon the thickness of layer 38. Increasing the Al composition in layer 35 increases the saturation charge concentration for the 2DEG region.

In view of these relationships, the thickness and Al content of layer 35 are selected so that, by itself, layer 35 doesn't add charge in the structure below, or adds an amount of charge in the access regions which is not large enough to satisfy the R$_{on}$ requirements of the application for which the device is being used. However, it is desirable, as discussed above, to have charge present in the channel access regions even when there is no voltage on the gate 31, and the charge density in the channel access regions is preferably greater than the charge density in the channel region underneath the gate when the gate is biased such that the device is in the ON state. One way to achieve this is to n-dope Al$_y$GaN layer 35 with Si, which acts as an n-type dopant in III-N devices. The greater the n-doping, the greater the resultant 2DEG charge in the channel access regions of layer 34. A preferred doping technique is called silicon delta doping, well known in the art. Alternatively, a uniform doping in layer 35 could be used, or other arbitrary doping profile.

If doping is used, the minimum effective amount is that required to achieve the target 2DEG charge in the channel access regions. Increasing the 2DEG charge, of course, increases the maximum ON current of the device, but also causes it to have a lower breakdown voltage. As the device must block voltage in the OFF condition, it is undesirable to have too low a breakdown voltage. Therefore, in selecting the amount of n-doping, it is necessary to provide a sufficiently high breakdown voltage for the applications for which the device will be used.

As an example, a device of the invention can have a switching voltage greater than 2 volts, preferably 2.5 volts, and a current flow through the channel of at least 200 mA per mm of gate width, preferably at least 300 mA per mm, when the channel is conductive. Preferably, the current through the channel when the channel is conductive should be at least 10,000 times the current that flows when the channel is not conductive.

Furthermore, there is a maximum charge, known as the saturation charge value, that is possible in the channel access regions, the magnitude of which depends upon the composition of layer 38. In general, if layer 38 is Al$_x$GaN, a higher Al composition in layer 38 results in a larger saturation charge value in the access regions. Therefore there is no need to dope region 35 beyond the amount required to create the maximum charge in the access regions.

The amount of required doping further depends upon the doping profile. If the dopant is placed near the bottom of layer 38, closer to channel layer 34, a larger 2DEG region is induced than if the dopant is placed farther away from channel layer 34. But it is undesirable to dope too close to the interface between layers 38 and 34 because that would lessen the mobility of electrons in the 2DEG region, which would increase the resistance of the 2DEG region, and thus the channel resistance.

One way to determine the aluminum concentration of layer 35 is to select the concentration so that, without the n-doping, no 2DEG charge will be formed in the channel access regions in the absence of the application of a gate voltage. Then the n-doping will create the 2DEG charge.

If desired, an additional cap nitride layer (not shown) can be placed atop layer 35. The nitride used may be In, Ga, or Al, or a combination of one or more of them. This layer may improve the surface properties of the device.

During device fabrication, a portion of Al$_y$GaN layer 35 is removed in region 36 under and around the gate region by a conventional etching step. This step, for example, can be a plasma RIE or ICP etch. The resulting structure has no charge under the gate region at 0 gate voltage, while a desired 2DEG charge still exists in the channel access regions shown within layer 34 by the two dotted lines. Where Si-doping is used, this 2DEG region is at least partially induced by the Si-doped layer 35.

Next, a conformal gate insulator 36 is deposited by methods well known in the art, such as PECVD, ICP, MOCVD, sputtering or other well know techniques. This insulator 36 can be silicon dioxide, silicon nitride, or any other insulator or combination of insulators. Alternatively, at least one of the insulators of layer 36 is a high-K dielectric, such as $HfO_2$, $Ta_2O_5$, or $ZrO_2$. Preferably at least one of the insulators contains or induces negative charge, thereby acting to deplete the channel region underneath the insulator. Examples of insulators which may act to deplete the underlying channel are AlSiN, $HfO_2$, and $Ta_2O_5$.

Next, the source and drain ohmic contacts 33 and 39 and the gate contact 31 are deposited by well known techniques. The order of these process steps may be changed, as is well known in the art. In addition, if desired, one or more field plates externally connected to either the gate 31 or source 33 may be used. SiN or other passivation layers may also be deposited over the entire structure including the contacts, as is known in the art.

Thus in the fully fabricated device, the $Al_xGaN$ layer 38 under the gate is thinner than the minimum required to form a 2DEG region beneath the gate at 0 gate voltage. The upper limit of this layer 38 thickness is called the "critical thickness." The minimum gate voltage for which a 2DEG region exists underneath the gate, thus rendering the channel conductive, is called the device threshold voltage $V_{th}$. For example, a $V_{th}$ of 0-3 volts may be used. If, for example, a $V_{th}$ of 3 volts were selected, a positive gate voltage greater than 3 volts is required to turn the device ON, thus inducing a 2DEG region under the gate region and achieving enhancement mode operation where current is conducted between source 33 and drain 39. If the gate voltage were less than 3 volts, the device would remain OFF. A higher threshold voltage is preferable to prevent accidental turn on of the device and to decrease leakage currents when it is intended to be OFF.

Without using the gate insulator 36, the maximum positive bias voltage that may be applied to the gate is limited by the schottky barrier forward turn on voltage of the gate junction, thus limiting the maximum full channel current. Using a gate insulator, a higher positive bias may be applied to the gate to accumulate a high channel 2DEG charge under the gate region when the device is ON, thus achieving substantial operating current. Furthermore, the gate insulator is also used to increase the external threshold voltage of an already normally-off device. In the case where the gate insulator acts to deplete charge from the underlying channel, the intrinsic threshold voltage is increased, and OFF state leakage decreases, since the source-drain barrier when the device is in the OFF state is increased.

Figure 4:
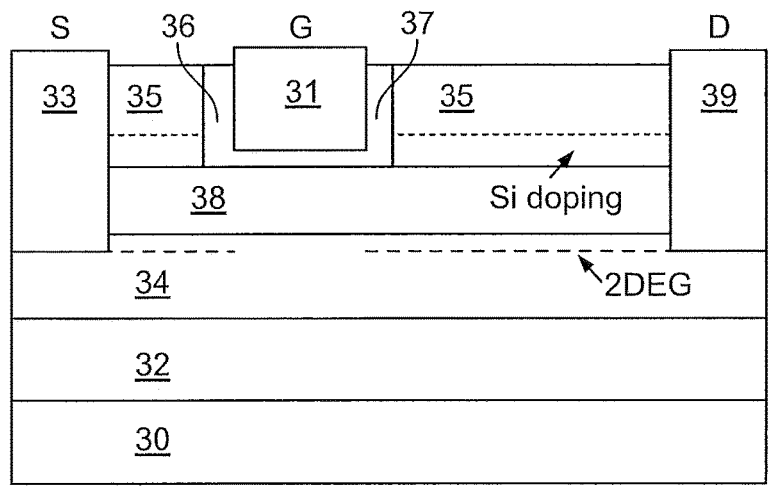
FIG. 4 is a cross-sectional view of a device of another embodiment of the invention.

Another embodiment of the device of the invention is shown in FIG. 4. The layers that are the same as in FIG. 2 have the same reference numerals. This device is similar to the one in FIG. 2, except that a nitride buffer layer 32 is included in between the nitride channel layer 34 and the substrate 30. Buffer layer 32 may be a nitride of gallium, indium or aluminum, or combinations of those nitrides. The composition of this buffer layer 32 is chosen such that the bandgap of the material is greater than that of the material of the channel layer 34, and the lattice constant is smaller than that of channel layer 34. Therefore, these two layers must be different materials. The larger bandgap of buffer layer 32 creates a back-barrier which reduces source-to-drain leakage currents when the device is in the OFF state. The smaller lattice constant of buffer layer 32 causes the overlying material of the channel layer 34 to be under compressive strain, which modifies the polarization field in these overlying materials in such a way that reduces the polarization-induced contribution to the 2DEG channel charge, thereby increasing the threshold voltage and reducing source-to-drain leakage currents when the device is in the OFF state. If, for example, buffer layer 32 is $Al_bIn_cGa_{1-b-c}N$, increasing b while keeping c constant increases the bandgap and decreases the lattice constant of layer 32, while increasing c while keeping b constant decreases the bandgap and increases the lattice constant. Therefore b and c are chosen in such a way that ensures that the bandgap of the material of buffer layer 32 is greater than that of the material of the channel layer 34, and the lattice constant of buffer layer 32 is smaller than that of channel layer 34.

When GaN is used for channel layer 34, buffer layer 32 is preferably $Al_zGaN$, where z is between a finite value greater than 0, and 1. The $Al_zGaN$ buffer layer 32 acts as a back-barrier, further increasing the source-drain barrier when the device is in the OFF state and increasing the device threshold voltage, as compared to the device of FIG. 2.

In the device shown in FIG. 4, the GaN layer 34 and AlGaN layer 38, which both overlie the $Al_zGaN$ buffer layer 32 are conformally strained to the $Al_zGaN$, which modifies the polarization fields in those two layers and thereby reduces the polarization-induced contribution to the 2DEG channel charge. The net result of these effects is that the "critical thickness" of the $Al_xGaN$ layer 38 is increased as compared to layer 38 of the device of FIG. 2. Having a thicker $Al_xGaN$ layer 38 in the device of FIG. 4, with buffer layer 32, is helpful in enabling manufacturability of these devices.

Source and drain contacts 33 and 39, respectively, are formed through the top surface of the device. Prior to the formation of source and drain contacts 33 and 39, respectively, layers 35, and 38 are etched so that the bottoms of these source and drain contacts can make electrical contact with nitride channel layer 34.

Figure 5:
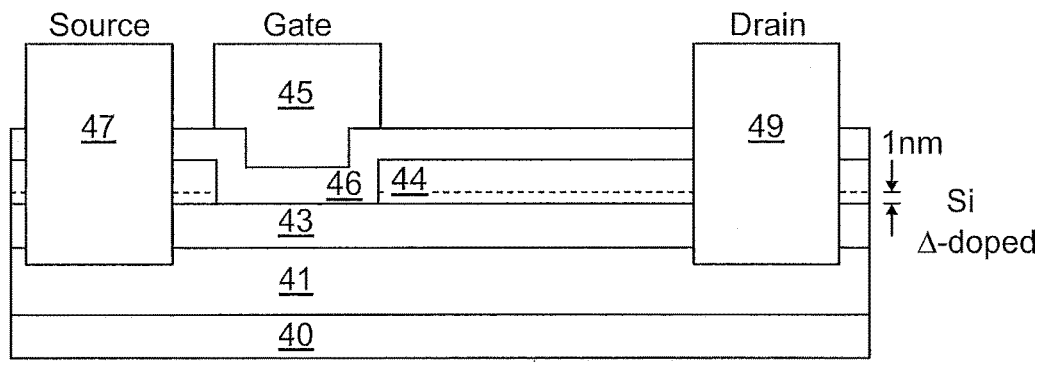
FIG. 5 is a cross-sectional view of a device of another embodiment of the invention.

A preferred embodiment of the device of the invention is shown in FIG. 5. A GaN buffer layer 41 is grown on a SiC substrate 40, followed by the deposition of a 3 nm thick $Al_{0.2}GaN$ layer 43, which is less than the critical thickness and hence does not induce any 2DEG region in area of the underlying GaN layer beneath gate 45. Next a 20 nm thick GaN layer 44 delta doped with Si between about $6 \times 10^{12}$ atoms/cm$^2$ and $8 \times 10^{12}$ atoms/cm$^2$ is formed atop $Al_{0.2}GaN$ layer 43. The $Al_{0.2}GaN$ layer 43 thickness in the area beneath the gate 45 needs to be about 5 nm thick or less. Source and drain regions 47 and 49 are formed on the top surface. Prior to the formation of source and drain contacts 47 and 49, respectively, layers 46, 44 and 43 are etched so that the bottoms of these source and drain contacts can make electrical contact with nitride buffer layer 41.

Figure 6:
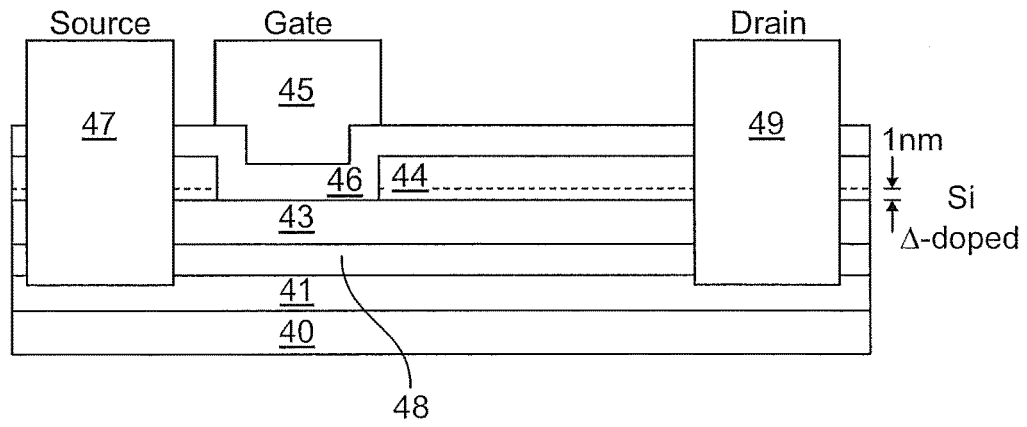
FIG. 6 is a cross-sectional view of a device of another embodiment of the invention.

An alternative embodiment of the device of FIG. 5 is shown in FIG. 6. The layers that are the same as in FIG. 5 have the same reference numerals. However in this embodiment, a thin intermediate AlN layer 48 is interposed between layers 41 and 43. Where such an intermediate AlN layer 48 is present, and where $Al_{0.2}GaN$ is used for layer 43, the $Al_{0.2}GaN$ layer 43 thickness in the area beneath the gate 45 needs to be about 1 nm or less.

Still referring to FIG. 5, a selective gate recess etch was performed to etch away the Si doped GaN layer 44 under and around the gate region 45, such that the gate recess etch stops at the $Al_{0.2}GaN$ layer 43. Selective etches are well known in the art that etch GaN (having no Al content) faster than AlGaN. The etch rate through the AlGaN layer 43 depends upon the percentage of Al in the layer, as these selective etches etch faster through layers with low aluminum content than through layers with higher Al content. Thus, according to the invention, a selective etch will etch in the area beneath gate 45 through the GaN layer 44 (that has no aluminum) at a faster rate than through $Al_{0.2}GaN$ layer 43, allowing $Al_{0.2}GaN$ layer 43 to act as an etch stop. The etch chemistry used is $BCl_3/SF_6$. The selectivity of the BCl$_3$/SF$_6$ selective etch of GaN over AlGaN(x=0.2) is about 25. When AlGaN is etched, the AlF$_3$ that is formed is non-volatile. Therefore the etch rate is reduced.

The higher the concentration of Al in layer 43, the more effective it will be as an etch stop. A preferred etch process for this purpose is inductively coupled plasma ion etching ("ICP") using a BCl$_3$/SF$_6$ etchant. Other Cl$_2$ or Fl$_2$ based reactive ion etching ("RIE") or plasma etching processes known in the art may be used.

Figure 7:
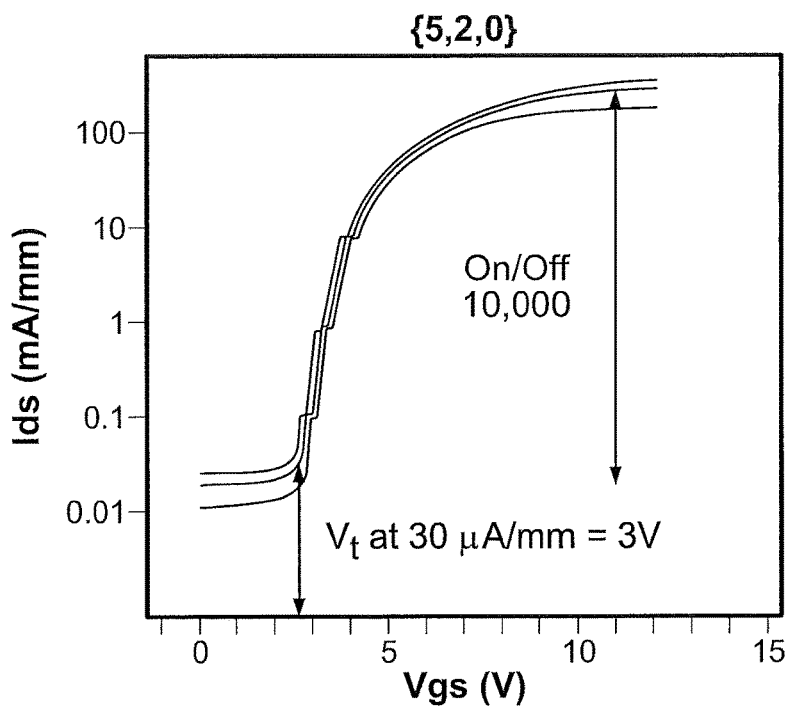
FIG. 7 is a graph showing the transfer characteristics of the device of FIG. 5.

A SiN layer 46 is then deposited to form the gate insulator, for example using a metal-organic CVD (MOCVD) or other suitable deposition process known in the art. The device is completed by forming source and drain ohmic contacts and a gate contact in a conventional manner to complete the structure of FIGS. 5 and 6. A further SiN passivation layer may be added to the full structure. The transfer characteristics of this device demonstrated enhancement mode operation with a +3 volt threshold, as shown in FIG. 7.

Figure 8A:
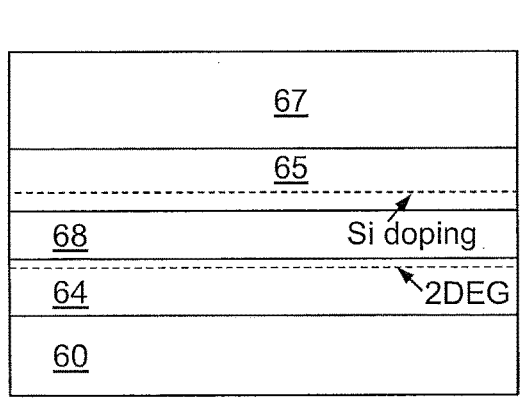
FIGS. 8a-8d show a method of fabrication for the device of FIG. 9.
Figure 8B:
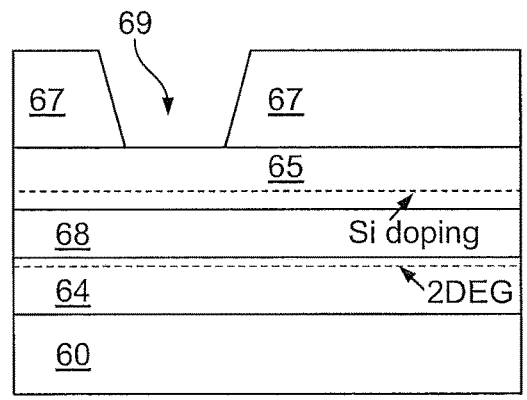
Figure 8C:
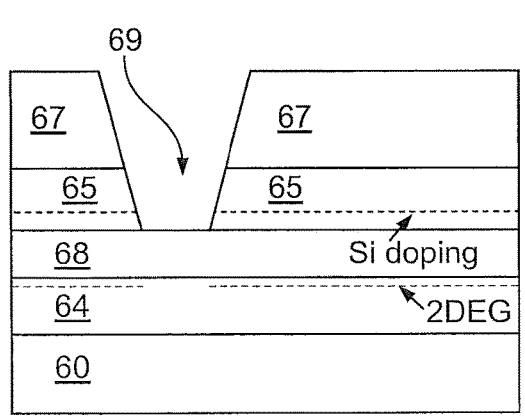
Figure 8D:
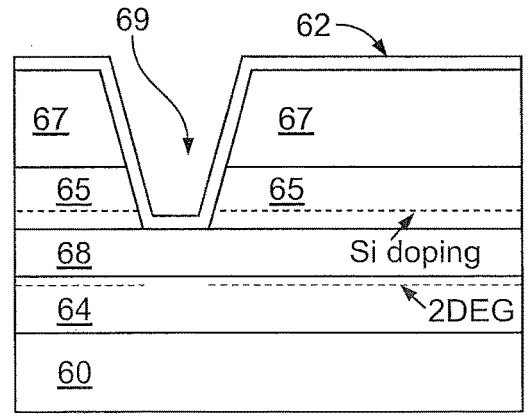

A method of fabrication of a device of one embodiment of the invention is illustrated in FIGS. 8a-8d. Referring to FIG. 8a, on top of substrate 60 are formed, in order, III-nitride layers 64, 68 and 65. On top of GaN layer 65 is formed a passivation layer 67 of SiN. Next, as shown in FIG. 8b, layer 67 is etched away in the gate region 69 using an etch chemistry which does not substantially etch III-nitride materials, such as CF$_4$/O$_2$, CHF$_3$ or SF$_6$. The etch process used results in a slanted sidewall, as shown, and the underlying layer 65 is not etched. This sidewall slant of opening 69 is achieved by methods well known in the art, for example by choosing a photoresist which has a slanted sidewall as a mask for the etch. Next, as seen in FIG. 8c, III-nitride layer 65 is etched in the gate region using previously etched layer 67 as an etch mask. The etch chemistry used must have certain properties. It must selectively etch nitride layer 65 at a higher rate than the underlying nitride layer 68. Thus, layer 68 serves as an etch stop, and so the etch terminates at the interface between layers 65 and 68 with a high level of precision. The etch chemistry must also etch passivation layer 67 at a rate which is the same or similar to the etch rate of layer 65. This ensures that the sidewall of opening 69 through layers 65 and 67 are tapered (as opposed to vertical), as shown. Next, as shown in FIG. 8d, a gate insulator 62, such as SiN, is deposited conformally over the surface of opening 69 and the top of layer 67.

Figure 9:
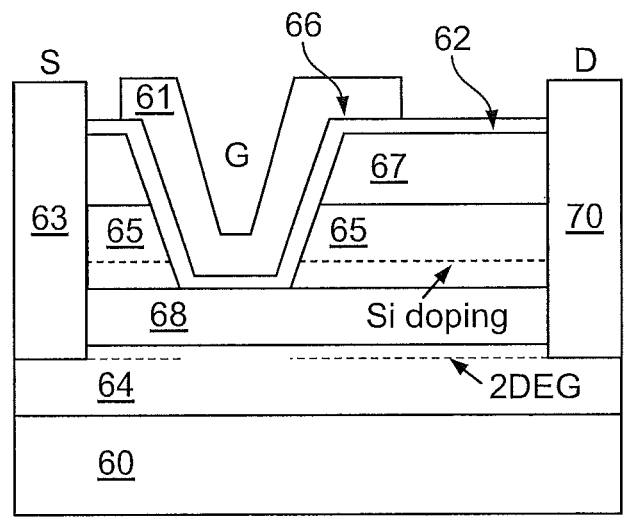
FIG. 9 is a cross-sectional view of a device of another embodiment of the invention.

To complete the device, as shown in FIG. 9, source 63, drain 70, and gate 61 electrodes are deposited. Prior to the formation of source and drain contacts 63 and 70, respectively, layers 67, 65, and 68 are etched so that the bottoms of these source and drain contacts can make electrical contact with nitride channel layer 64. In the embodiment of the invention shown in FIG. 9, the substrate and III-nitride material layers are similar to those of FIG. 2. However, the embodiment shown in FIG. 9 also contains a dielectric passivation layer 67 which covers the surface of the gallium nitride layer 65 furthest from substrate. Layer 67 is comprised of any material suitable for surface passivation of III-nitride devices as is known in the art, for example, SiN. Nitride layer 65 and passivation layer 67 are tapered down as shown underneath the sides of the gate metal. Having a tapered sidewall of the gate (as opposed to a perfectly vertical one) allows the gate metal also to act as a slant field plate in region 66, which increases the device breakdown voltage by decreasing the maximum electric field in the device.

Figure 10:
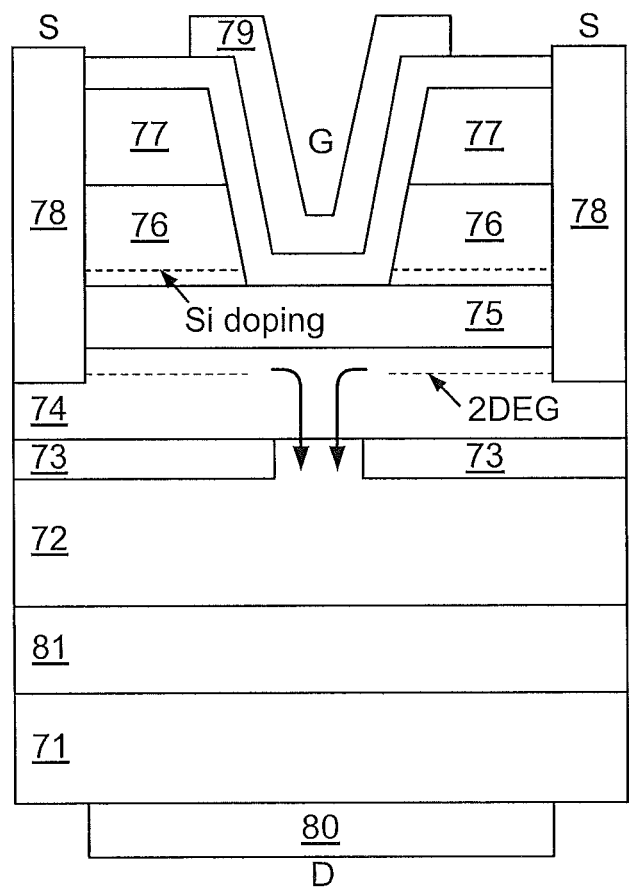
FIG. 10 is a cross-sectional view of a device of another embodiment of the invention.

Another embodiment of the invention is a vertical device shown in FIG. 10. In a vertical device the source and gate contacts 78 and 79, respectively, are on the top surface of the device while the drain contact 80 is at the bottom, as shown. Vertical devices have the benefit of using less wafer area for a similar size device as compared to the lateral devices described earlier.

To make a vertical device for enhancement mode operation, a lightly doped (n−) GaN drift layer 72 is incorporated below the GaN channel layer 74. The thickness of drift layer 72 determines the blocking voltage capability of the device, as this layer sets the effective gate-to-drain spacing. The doping amount for layer 72 is chosen to maximize its conductivity, thereby minimizing its resistance, and to support the required blocking voltage, as discussed earlier. If the doping is too low, the resistance can be too high. If the doping is too high, the blocking voltage can be too low.

Blocking layer 73 blocks direct current flow from source 78 to drain 80. If such direct current flow were permitted, it would provide an undesirable, parasitic leakage current path in the device. Blocking layer 73 can be made in various ways. In one method, p-type regions 73 are formed by suitable techniques, for example ion implantation, or by using a 2-step growth process in which a p-type layer 73 is grown completely across n− GaN layer 72, and is then removed under the gate region (where the current path is indicated by the arrows), followed by a growth of layers 74 and above. The material of layer 74 merely fills in where layer 73 had been removed.

In another method an insulating GaN layer is used for the blocking layer 73. This can be formed by suitable techniques such as doping GaN layer 73 with iron, or by an isolation ion implantation of Al or other suitable material that results in the placement of an insulating GaN material in the blocking regions 73. Other methods, such as a regrowth of material in layer 73 may also be used.

Figure 11:
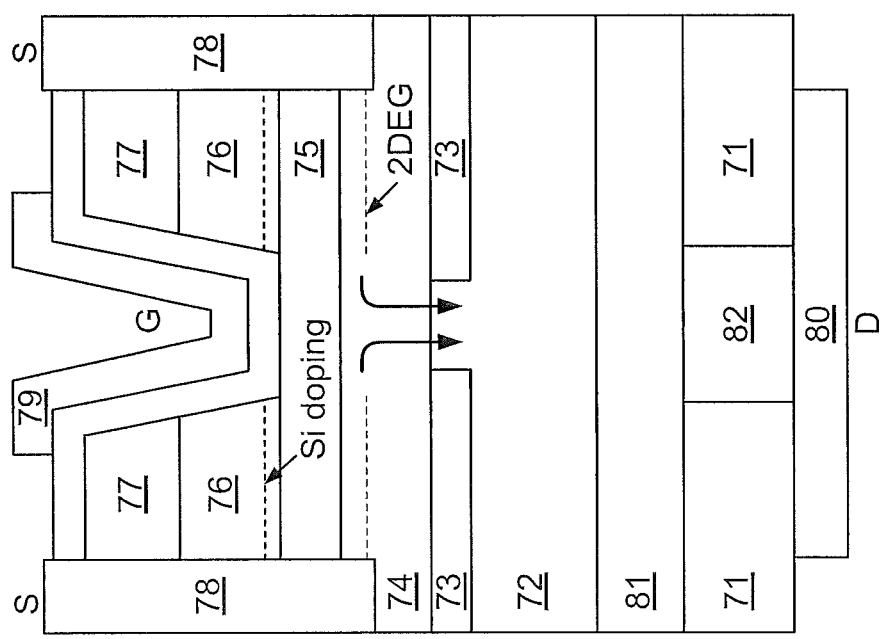
FIG. 11 is a cross-sectional view of a device of another embodiment of the invention.

Another embodiment of the invention, shown in FIG. 11, employs a blocking layer, and a highly doped n+ GaN contact layer 81 is placed below the GaN drift layer 72. The entire structure is grown on a semi-insulating substrate 71. Prior to deposition of drain ohmic contact 80, via 82 is formed by etching through substrate 71. The drain ohmic contact 80 makes contact with layer 81 through via 82.

The drain contact to layer 81 may be made in other ways. As shown in FIG. 11 the device is grown on a conducting substrate 71, which may, for example, be conducting silicon, GaN or SiC. In this structure, via 82 is not required, since the drain contact 80 is simply made to the bottom of the substrate 71. In the embodiment of FIG. 11 which uses an insulating substrate, a via is etched through the substrate through which the drain contact with layer 81 is made.

Figure 12:
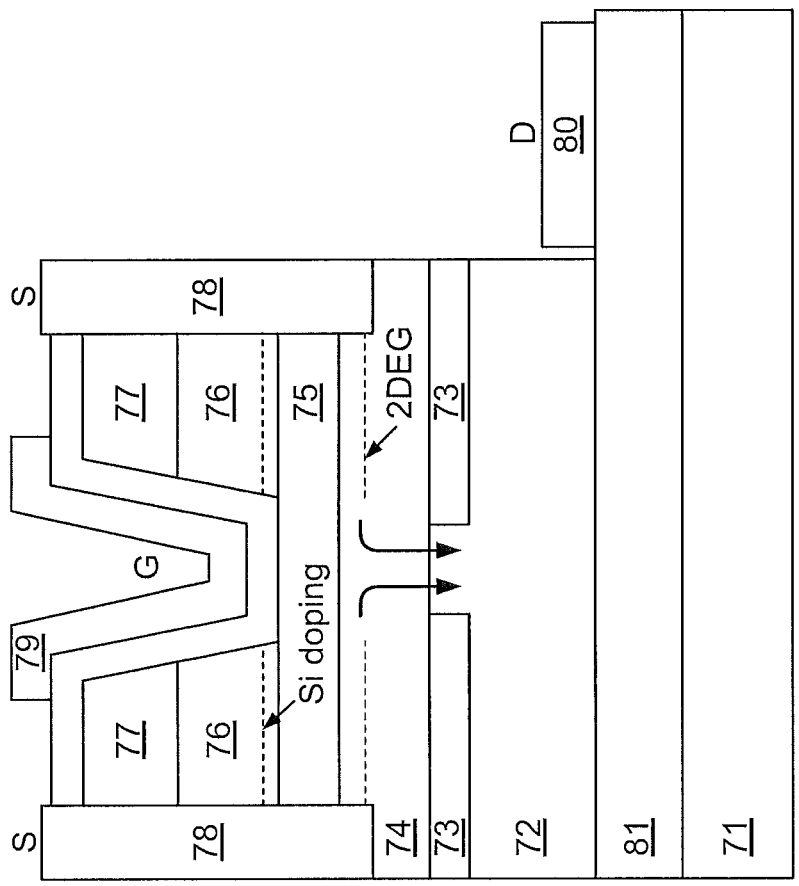
FIG. 12 is a cross-sectional view of a device of another embodiment of the invention.

In another implementation shown in FIG. 12, a lateral mesa is etched as shown, and the drain contact 80 is made on the top side of the highly doped GaN contact layer 81.

Figure 13A:
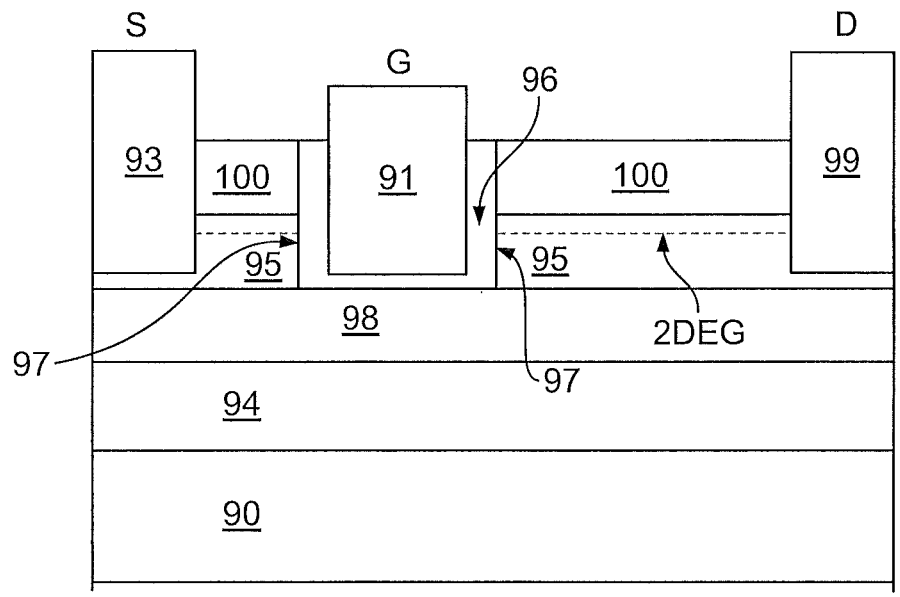
FIGS. 13a and 13b are cross-sectional views of a device of another embodiment of the invention.
Figure 13B:
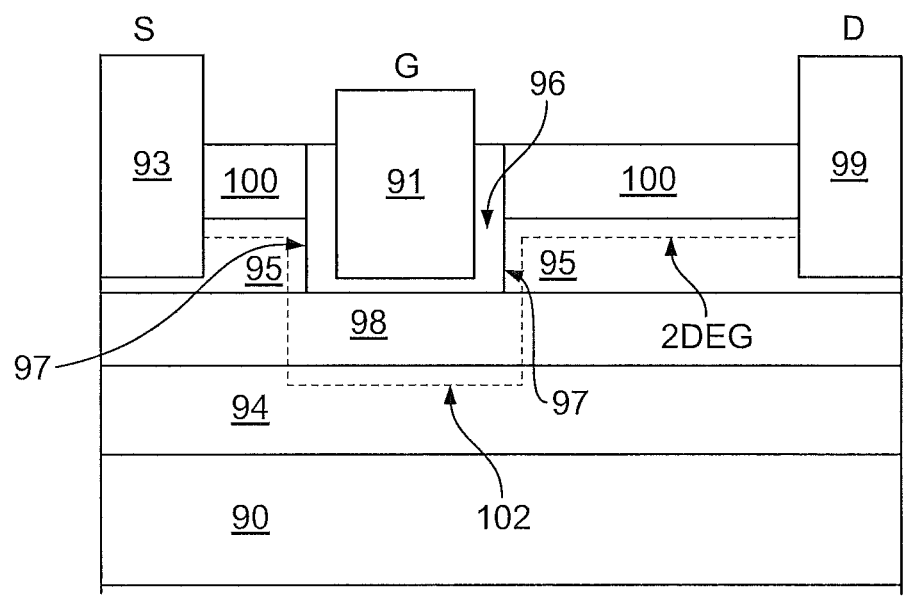

Another embodiment of this invention is show in FIGS. 13a and 13b. The device of FIG. 13b includes a substrate 90, a nitride channel layer 94 on the substrate, including a first channel region shown as a dotted line 102 in layer 94 beneath the gate 91. The material of the nitride channel layer 94 is selected from the group consisting of nitrides of gallium, indium and aluminum, and combinations thereof. The device has an AlXN layer 98 adjacent the channel layer 94, where X is selected from the group consisting of gallium, indium or their combination. A III-N layer 95 is adjacent the AlXN layer, that includes two channel access regions shown by dotted lines on opposite sides of the gate 91 and the first channel regions 102. This III-N layer can be GaN, InN or a combination of the two, preferably GaN. These two channel access regions are respectively connected to the source 93 and the drain 99. In one embodiment of this device, there is an Al$_m$GaN layer 100 atop the III-N layer 95 that is used for enabling the 2DEG charge in the channel access regions. m is in the range of 0.1 to 0.3 and the thickness of the layer 100 is in the range of 100-500 Angstroms, the composition and thickness range being selected to achieve an equivalent sheet resistance of under 700 ohms/square in this region.

In this embodiment, the 2DEG channel access regions are formed in a different layer 95 from the first channel region 102 controlled by the gate 91. In an enhancement-mode device, the channel access regions need to be as conductive as possible at all times, whereas the first channel region 102 beneath the gate needs to be depleted of conducting charge in the absence of a control voltage applied to the gate 91. The device in FIGS. 13a and 13b, having the charge in the channel access regions in a different layer 95 from the layer 94, that contains the charge 102 beneath the gate that is only present when the device is "ON", has more flexible design parameters than devices that have their the channel access regions and their first channel region in the same layer or devices that involve substantial trade-offs in access region charge vs. the charge in the nitride channel layer 94 that is modulated by the gate.

FIG. 13a illustrates a device where there is no voltage applied to the gate, and FIG. 13b shows the device when a positive control voltage is applied to gate. The material layers are similar to the layers in prior embodiments, except that the thicknesses and compositions of layers 95 and 100 are adjusted so that, in the absence of a control voltage applied to the gate, a substantial 2DEG channel exists in the access regions in layer 95 but not in the first channel region 102. As seen in FIG. 13b, when a positive control voltage is applied to the gate electrode 91, a conducting 2DEG channel shown by the dotted line is formed in layer 94 adjacent to the interface between layers 94 and 98 in region 102 underneath the gate 91. Further, a vertical conducting region is formed in layer 95 adjacent the sidewall 97 of insulator 96, resulting from the accumulation of charge from the positive control voltage on the gate. In addition, a path is formed via the mechanisms of tunneling through the barrier or emission over the barrier or both, through layer 98 which connects the 2DEG and conducting regions in layer 95 to the conducting 2DEG channel in region 94, completing the conduction path from source 93 to drain 99. Thus, an important feature of this structure is that the gate is modulating charge both beneath itself and along its sides when a switching voltage is applied to the gate.

When a switching voltage is applied to the gate, the conducting channel extends all the way from the source 93 to the drain 99, and the device is turned ON. In this embodiment, source 93 and drain 99 extend downwardly from the surface of the device at least deep enough so that they are in electrical contact with the 2DEG region in layer 95 (shown by the dotted lines), but not necessarily any deeper. This is different from previous embodiments where the 2DEG access regions are in the same layer as the 2DEG first channel region that is formed under the gate in the presence of a gate voltage above a threshold, where the source and drain contacts must extend downwardly even farther.

This device of this embodiment of the invention may be constructed in a number of ways. For example, source 93 and drain 99 may be formed by depositing a metal layer 100, such as a Ti/Al/Ni/Au stack, in the source and drain regions 93 and 99, and then annealing the device at an elevated temperature such that the metal and underlying semiconductor material form a conducting alloy which extends at least beyond the interface of layers 100 and 95, as shown in FIGS. 13a and 13b. Alternatively, source 93 and drain 99 may be formed by implanting an n-type dopant, such as silicon, into layers 100 and 95 in the places where the source and drain are to be formed and in the source and drain access regions, and then depositing a metal, such as Ti, Al, Ni, Au, or a combination thereof atop the implanted areas to serve as the source and drain contacts. In this case, source 93 and drain 99 are comprised of a combination of the metal and the implanted semiconductor material.

Figure 14A:
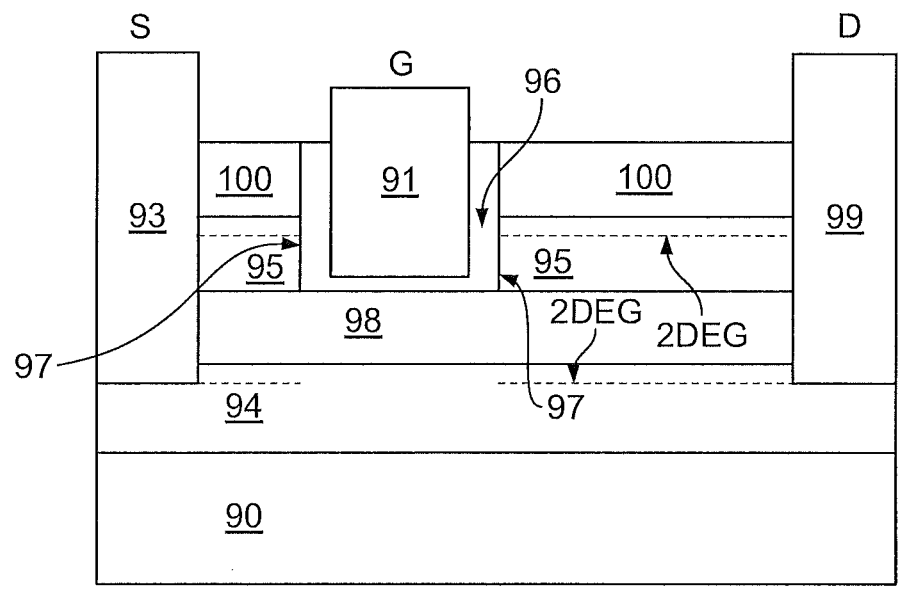
FIGS. 14a and 14b are cross-sectional views of a device of another embodiment of the invention.
Figure 14B:
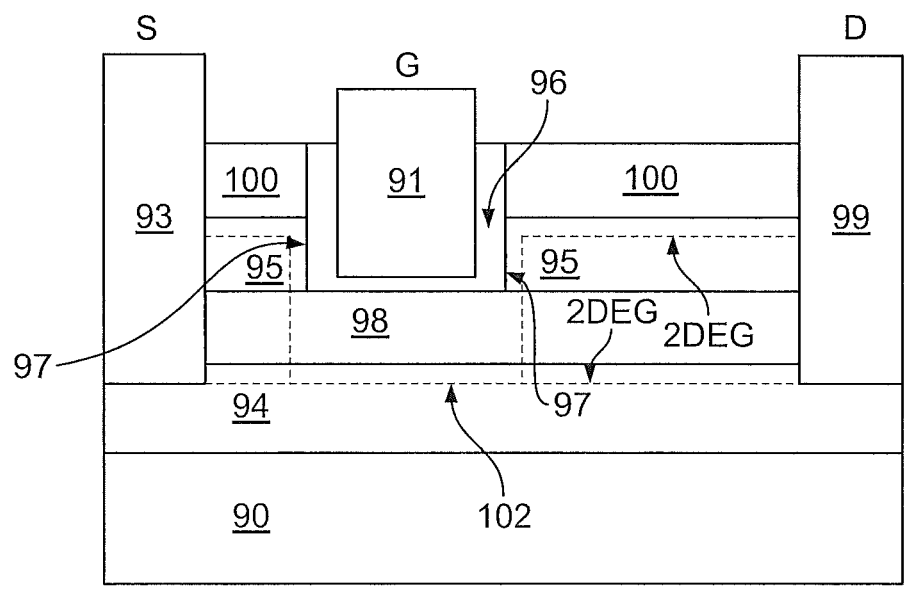

Source 93 and drain 99 may extend deeper than the minimum depth illustrated in FIGS. 13a and 13b. As shown in FIGS. 14a and 14b, the source and drain 93 and 99 extend downwardly beyond the interface of layers 94 and 98, as will be discussed below. As shown in FIG. 14a, the Al compositions of layers 98, 95, and 100 are adjusted such that a 2DEG region shown by the dotted line is present in the access regions in layers 95 and 94, but not underneath the gate 91, in the absence of an applied gate voltage.

By way of example, the embodiment of the invention shown in FIGS. 14a and 14b can be achieved with the following parameters for layers 98, 95, and 100: layer 98 is a 3 nm thick Al$_x$GaN layer with x=0.23; layer 95 is a 3 nm thick GaN layer; and layer 100 is a 15 nm Al$_m$GaN layer with m=0.23. In this example, a 2DEG region is expected to be present in the access regions in layers 95 and 94, shown by the dotted lines, and the 2DEG sheet charge density in layer 94 is approximately two times that in layer 95.

As shown in FIG. 14b, when a positive control voltage is applied to the gate electrode 91, a conducting 2DEG channel 102 is formed beneath gate 91, shown by the dotted line in layer 94, adjacent the interface between layers 94 and 98 in region 102 underneath the gate. Further, a vertical conducting region is formed in layer 95 adjacent sidewall 97 of insulator 96, resulting from the accumulation of charge from the positive control voltage on the gate 91. In addition, a path via the mechanisms of tunneling through the barrier or emission over the barrier, or both, is formed through layer 98. This path connects the 2DEG channel access regions in layer 95 to the conducting 2DEG channel in layer 94, completing the conduction path from source 93 to drain 99. Thus, when the device is ON, as shown in FIG. 14b, the conducting channel from source 93 to drain 99 comprises the 2DEG channel in layer 94 underneath the gate, along with the two in-line 2DEG channel access regions in layer 95 which are connected by the vertical conducting regions in layers 95 and 98. This is shown in FIG. 14b.

This structure of this device reduces the access resistance and thereby reduces the device ON resistance R$_{on}$, because the contacts for the source 93 and drain 99 extend downwardly beyond the interface of layers 94 and 98. That allows the 2DEG regions in the access regions of layers 95 and 2DEG conductive region of layer 94 that is present when the device is ON, to form a conductive path between the source 93 and drain 99.

The device of FIG. 14 will operate properly as an enhancement-mode device if source 93 and drain 99 extend downwardly just beyond the interface of layers 100 and 95, as was the case for the device in the embodiment shown in FIG. 13. However, in that case the source 93 and drain 99 will only contact the 2DEG region in layer 95 and not that in layer 94, so the access resistance and device on resistance R$_{on}$ remain similar to the device in FIG. 13.

Additionally, layers 95, 94, 98 and/or layer 100 may be doped with an n-type dopant, such as Si, to further enhance 2DEG charge in the access regions of layer 95 and/or layer 94. Furthermore, an additional III-N layer (not shown), such as AlInGaN, may be included on top of $Al_mGaN$ layer 100 in the devices shown in FIGS. 13 and 14, to help mitigate dispersion in the device.

Figure 15:
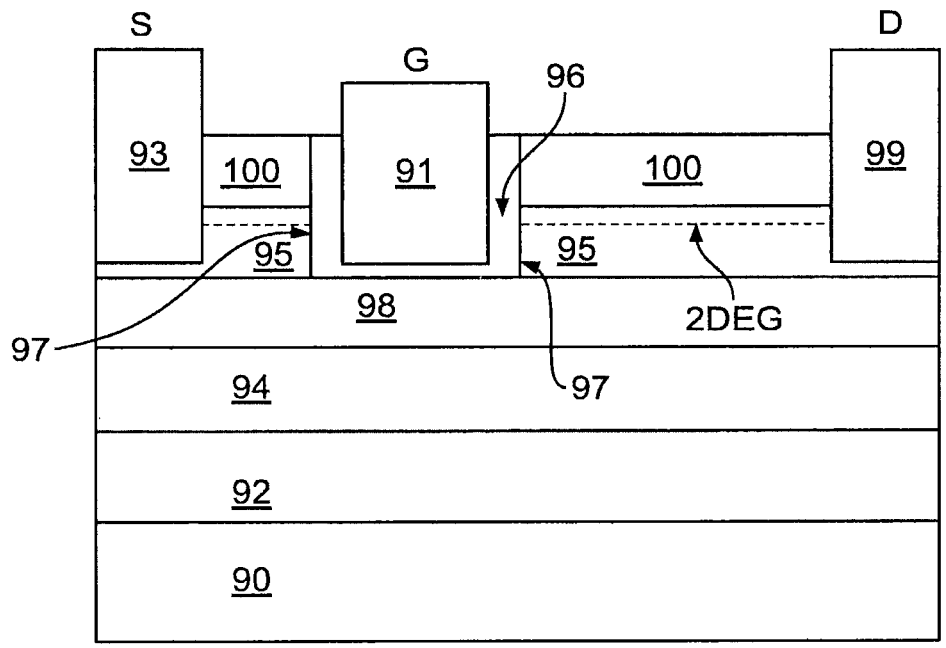
FIG. 15 is a cross-sectional view of a device of another embodiment of the invention.

Another embodiment of the device of the invention is shown in FIG. 15. The layers that are the same as the devices in FIGS. 13 and 14 have the same reference numerals. This device is similar to the one shown in FIG. 13, except that a nitride buffer layer 92 is included between the nitride channel layer 94 and the substrate 90. This buffer layer has the same parameters and is used for the same purpose described above with respect to the embodiment shown in FIG. 4.

Figure 16:
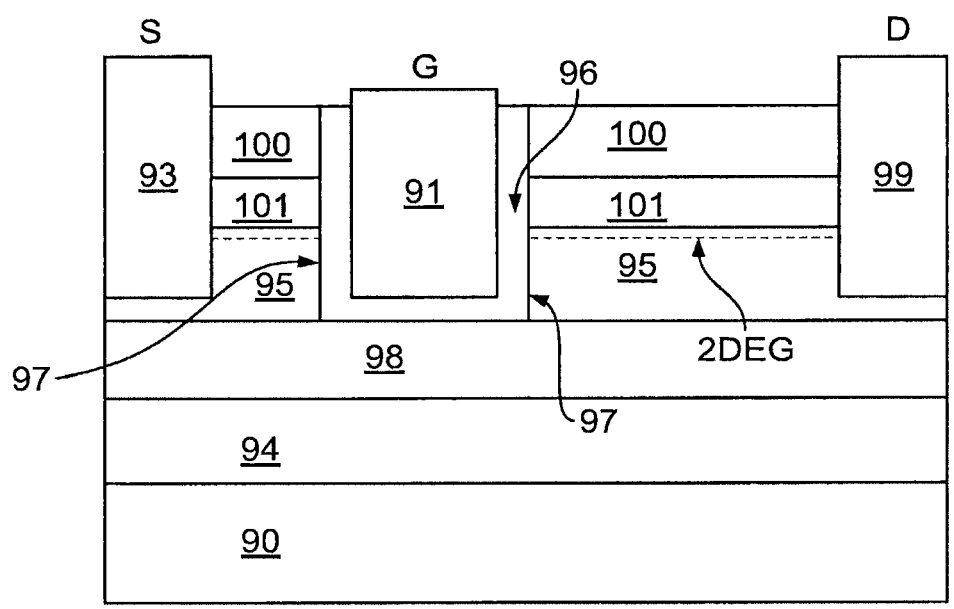
FIG. 16 is a cross-sectional view of a device of another embodiment of the invention.

Another embodiment of the invention is shown in FIG. 16. This device is the same as that of FIG. 13, except that it has no buffer layer between the nitride channel layer 94 and the substrate 90, but has a thin AlN layer 101 is included in between GaN layer 95 and $Al_mGaN$ 100. This AlN layer 101 causes an increase in the charge density and electron mobility in the 2DEG charge in the access regions in layer 95, thereby decreasing the access resistance and thus the device on-resistance $R_{on}$. Preferably this layer should be between about 4 Å and 30 Å thick.

Figure 17:
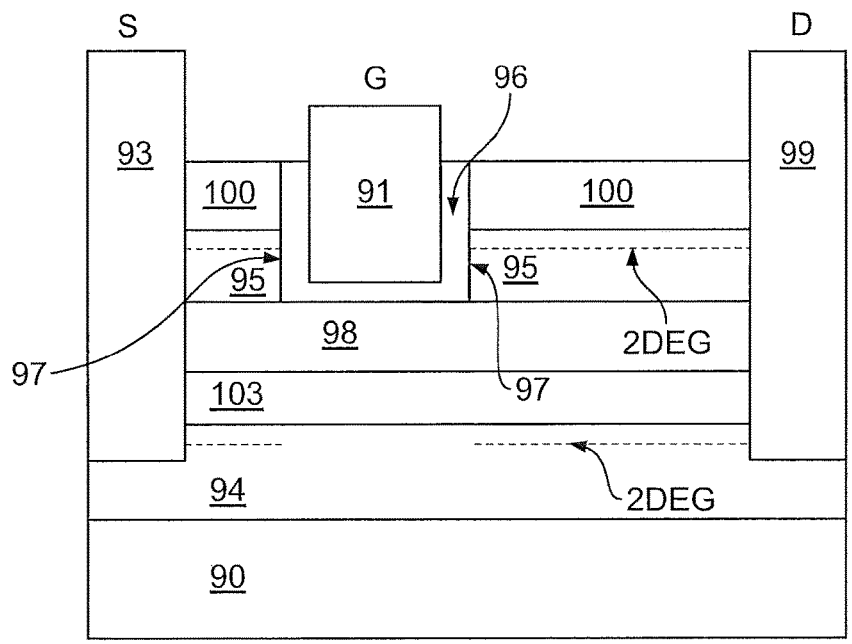
FIG. 17 is a cross-sectional view of a device of another embodiment of the invention.

Another embodiment of the invention is shown in FIG. 17. This device is the same as that of FIG. 14, except that a thin AlN layer 103 is included between channel layer 94 and $Al_xGaN$ 98. This AlN layer 103 causes an increase in the charge density and electron mobility in the 2DEG charge access regions in layer 94, thereby decreasing the access resistance and thus device on-resistance $R_{on}$. Additionally, the gate 91 is deposited in the gate recess opening, which was formed by first recess etching and then filling the recess with an insulator 96, as discussed in connection with earlier embodiments, and the gate recess stops precisely at the upper surface of layer 98, as shown in FIG. 17.

Figure 18A:
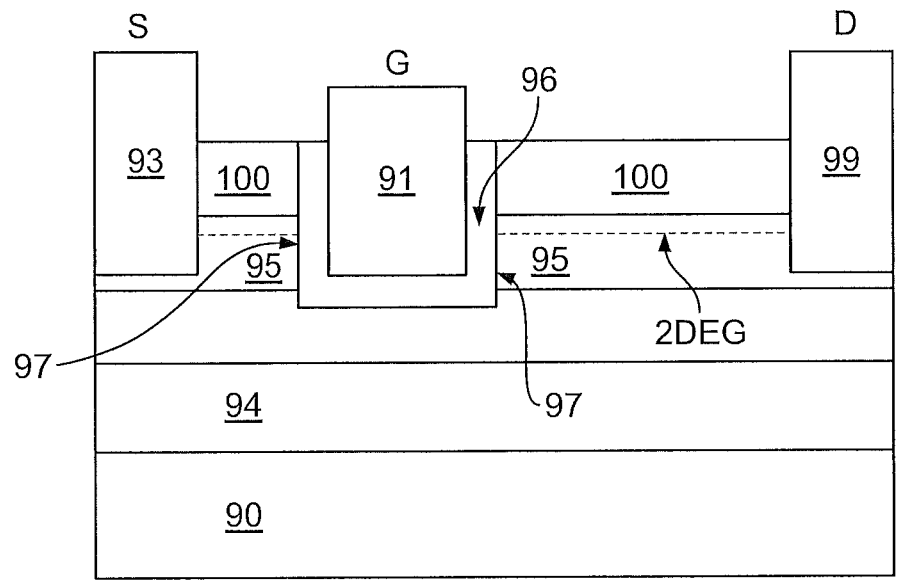
FIGS. 18a and 18b are cross-sectional views of a device of two other embodiments of the invention.
Figure 18B:
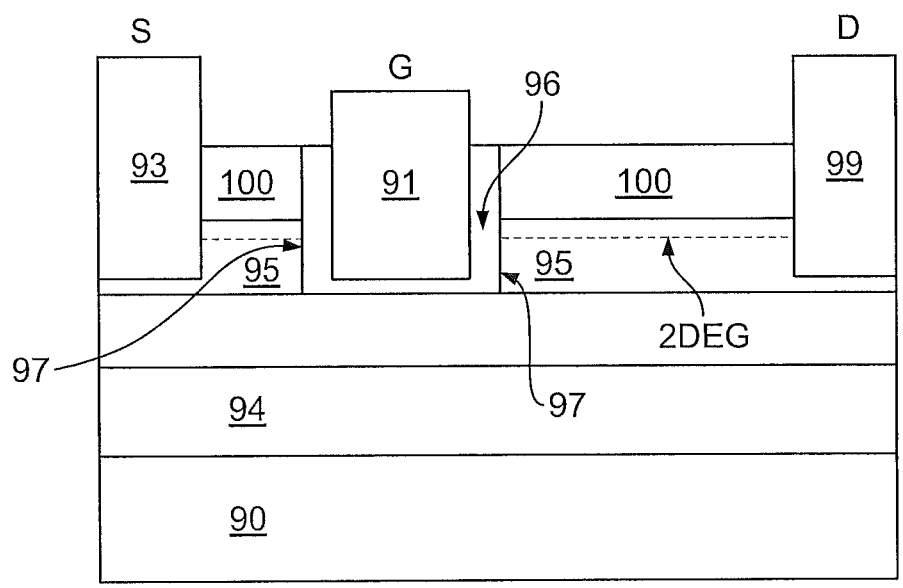

Another embodiment of this invention is shown in FIGS. 18a and 18b. This device is the same as that of FIG. 17, except that the $Al_xGaN$ and AlN layers between layers 95 and 94 have been omitted. Furthermore, the recess etched gate 91 extends below the interface between layers 95 and 94 further down inside the bulk of layer 94, as shown in FIG. 18a, and the source 93 and drain 99 extend only into layer 95 so as to contact the 2DEG region shown by the dotted line in layer 95, but not so far as to contact layer 94.

The difference between the device of FIG. 18a and the device of FIG. 18b is that, in FIG. 18b, the gate insulator region 96 stops precisely at the top of nitride channel layer 94, but in the device of FIG. 18a, the gate insulator region 96 extends beyond the interface between layers 94 and 95. When a positive control voltage is applied to the gate 91 of the device of FIG. 18b, the conducting channel produced underneath the gate 91 may be a 2DEG region, or alternatively may be an electron accumulation layer.

Although the transfer characteristics of the device of FIG. 18a may be inferior compared to those of the device in FIG. 18b, this device is more tolerant to variations in processing conditions, since it does not rely upon a precise etch stop at the top of layer 94 to operate properly. It is therefore more easily manufacturable.

Figure 19:
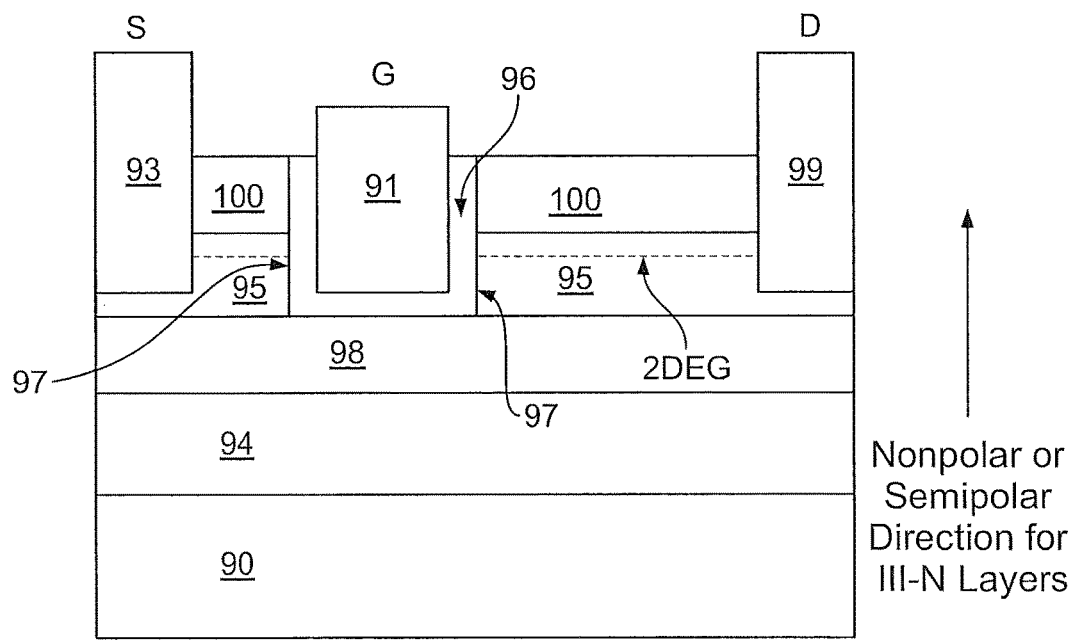
FIGS. 19-23 are cross-sectional views of devices of other embodiments of the invention.

Another embodiment of this invention is shown in FIG. 19. This device is similar to that of FIG. 13, except that all of the III-nitride layers are grown in a nonpolar or semipolar (Ga terminated) orientation (as compared to the [0 0 0 1] orientations of the other embodiments of this invention). Using semipolar or nonpolar layers increases the threshold voltage of the device as well as increasing the barrier between source and drain when the device is in the OFF state, thereby reducing OFF state leakage. However, in this structure of FIG. 19, $Al_mGaN$ layer 100 and/or GaN layer 95 is doped with an n-type dopant, such as Si, to ensure that a conducting channel exists at all times in the 2DEG access regions in layer 95.

Figure 21:
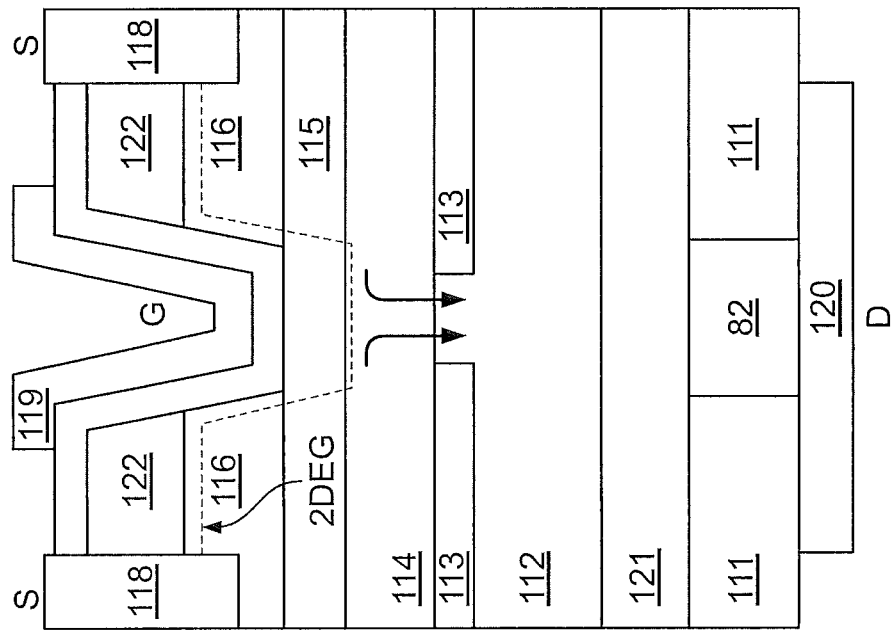
Figure 20:
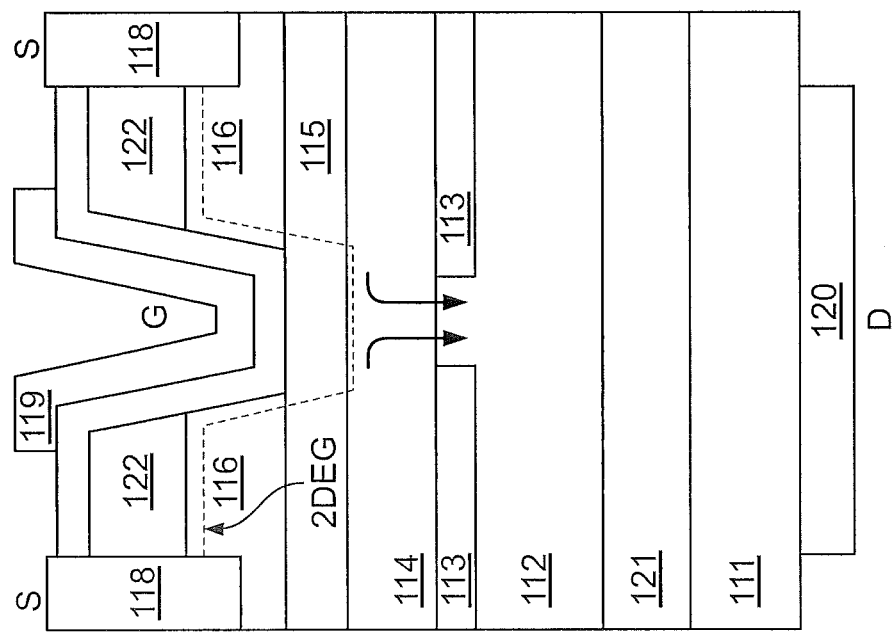
Figure 22:
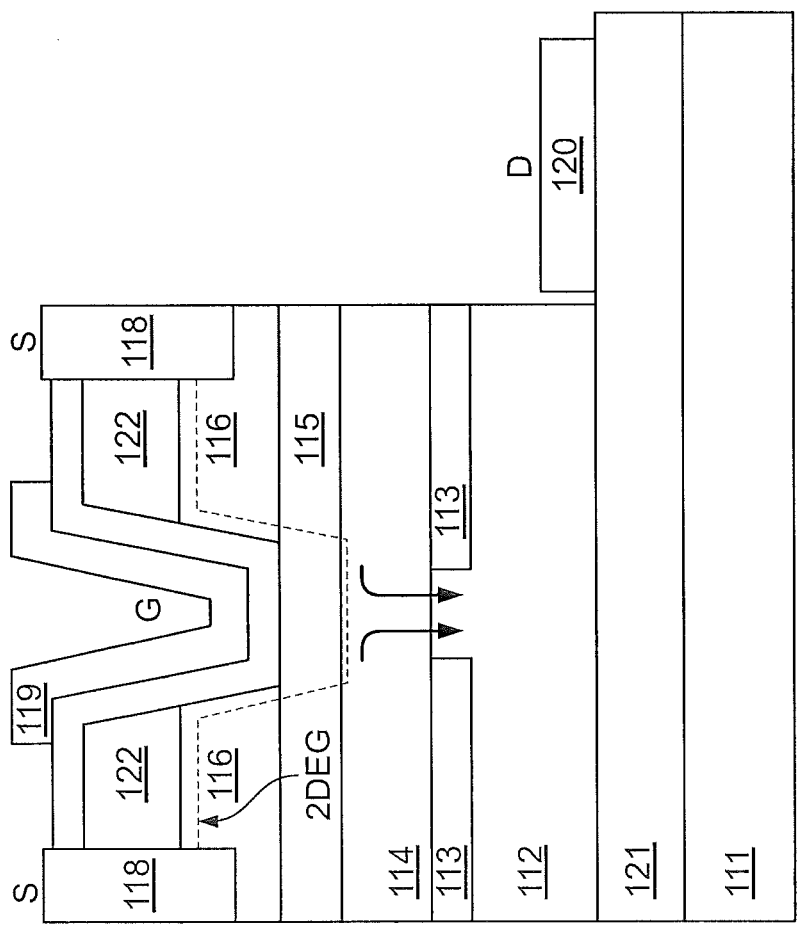

More embodiments of this invention are shown in FIGS. 20-22. These are all vertical devices similar to those shown in FIGS. 10-12, except that the 2DEG access regions are contained in layer 116, and when the device is biased ON, a vertical conduction region is induced in region 116 by the gate 119, and a conducting path is formed through layer 115, to connect the access regions in layer 116 to the 2DEG region in layer 114 underneath the gate 119, much like the device in FIG. 13.

Figure 23:
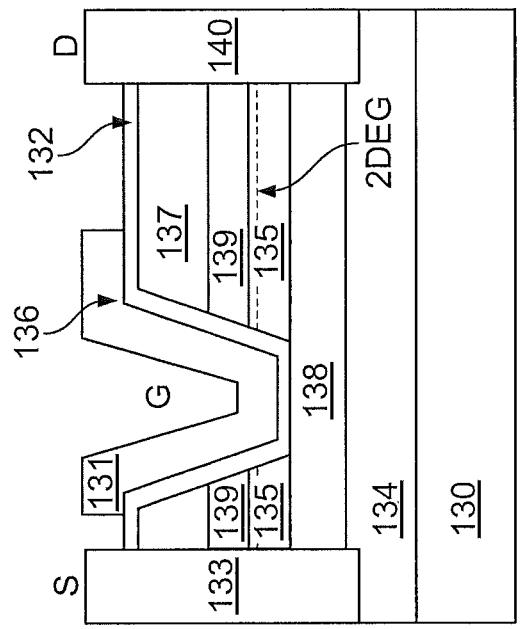

Another embodiment of this invention is shown in FIG. 23. This device is similar to the device in FIG. 14, but the slanted gate 131, the SiN passivation layer 137 and the gate insulator layer 132 make this device similar to the device of FIG. 9.

Figure 24A:
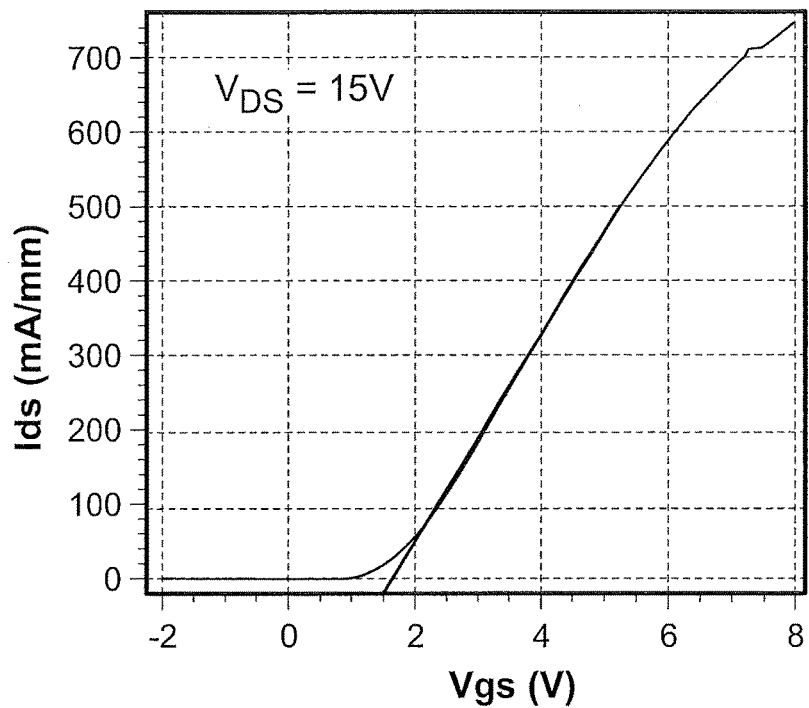
FIGS. 24a, 24b and 24c are graphs depicting the operation of the device of FIG. 23.
Figure 24B:
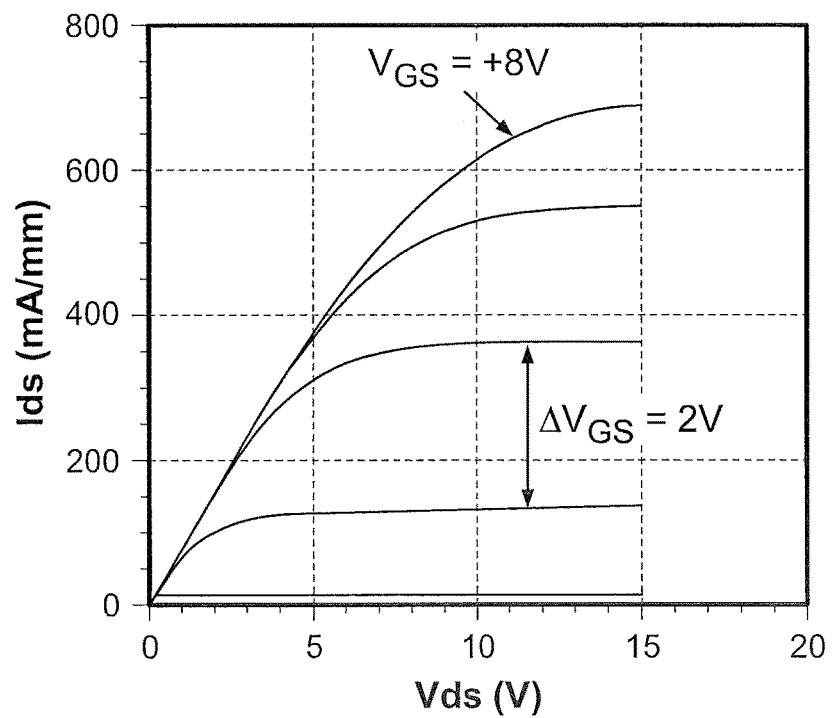
Figure 24C:
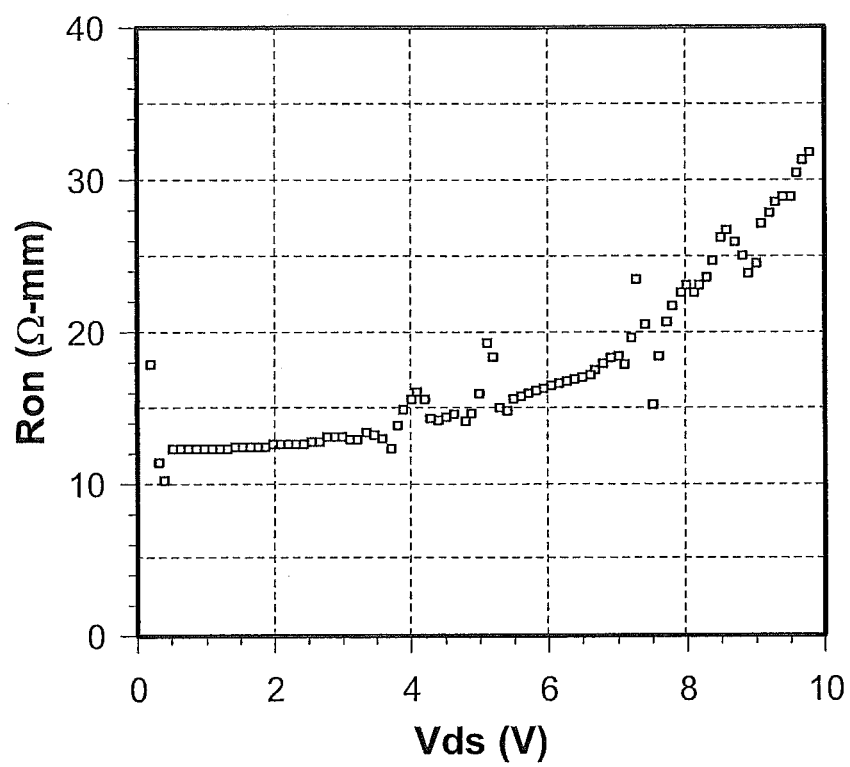

A device having the structure shown in FIG. 16 was fabricated and had the output characteristics shown in FIGS. 24a, 24b and 24c. The threshold voltage $V_{th}$ was 1.5V, the ON-resistance $R_{on}$ was 12 ohm-mm, and the maximum source-drain current $I_{max}$ was 700 mA/mm at a gate voltage $V_G$=8V.

There may be many variations on the structures and methods described above that are, or will become apparent to those skilled in the art, that may be used in connection with, but without departing from the spirit and scope of this invention.

What is claimed is:

1. A III-N semiconductor device comprising:
    a nitride channel layer including a first channel region beneath a conductive gate contact, the composition of the nitride channel layer being selected from the group consisting of nitrides of gallium, indium, aluminum, and combinations thereof;
    a source contact and a drain contact, wherein the source contact and the gate contact are each over the nitride channel layer and the drain contact is below on an opposite side of the nitride channel layer from the gate contact;
    a GaN drift layer between the nitride channel layer and the drain contact; and
    a current blocking layer between the nitride channel layer and the GaN drift layer,
    wherein the first channel region is non-conductive in the absence of a switching voltage applied to the gate contact, but is conductive in the presence of a switching voltage greater than a threshold voltage applied to the gate contact, and
    wherein the device includes channel access regions on opposite sides of the first channel region, and the current blocking layer is below the channel access regions but not below the first channel region.

2. The device of claim 1, wherein the GaN drift layer is a lightly doped (n−) layer.

3. The device of claim 1, wherein the current blocking layer is a doped GaN layer.

4. A III-N semiconductor device comprising:
    a nitride channel layer including a first channel region beneath a conductive gate contact, the composition of the nitride channel layer being selected from the group consisting of nitrides of gallium, indium, aluminum, and combinations thereof;
    a source contact and a drain contact, wherein the source contact and the gate contact are each over the nitride channel layer and the drain contact is below on an opposite side of the nitride channel layer from the gate contact;

a GaN drift layer between the nitride channel layer and the drain contact; and a current blocking layer between the nitride channel layer and the GaN drift layer;

a substrate; and an additional nitride layer between the substrate and the GaN drift layer, wherein a via is formed through the substrate and the drain makes contact with the additional nitride layer through the via, and wherein the first channel region is non-conductive in the absence of a switching voltage applied to the gate contact, but is conductive in the presence of a switching voltage greater than a threshold voltage applied to the gate contact.

5. The device of claim 4, wherein the additional nitride layer comprises highly doped n+ GaN.

6. A III-N semiconductor device a nitride channel layer including a first channel region beneath a conductive gate contact, the composition of the nitride channel layer being selected from the group consisting of nitrides of gallium, indium, aluminum, and combinations thereof;

a source contact and a drain contact, wherein the source contact and the gate contact are each over the nitride channel layer and the drain contact is below on an opposite side of the nitride channel layer from the gate contact; and channel access regions on opposite sides of the first channel region, wherein the device comprises an AlXN layer above the channel layer in the areas adjacent to the channel access regions but not in the area adjacent to the first channel region, wherein X is selected from the group consisting of gallium, indium or their combination, and wherein the first channel region is non-conductive in the absence of a switching voltage applied to the gate contact, but is conductive in the presence of a switching voltage greater than a threshold voltage applied to the gate contact.

7. The device of claim 6, wherein the device comprises an insulator layer between the gate contact and the nitride channel layer.

8. The device of claim 6, wherein the device is an enhancement mode device.

\* \* \* \* \*